United States Patent
Jandak et al.

(10) Patent No.: US 10,822,225 B2
(45) Date of Patent: Nov. 3, 2020

(54) MEMS SENSORS WITH SELECTIVELY ADJUSTED DAMPING OF SUSPENSION

(71) Applicant: Honeywell International Inc., Morris Plains, NJ (US)

(72) Inventors: Mikulas Jandak, Vienna (AT); Michael Schneider, Vienna (AT); Ulrich Schmid, Vienna (AT)

(73) Assignee: Honeywell International Inc., Charlotte, NC (US)

( * ) Notice: Subject to any disclaimer, the term of this patent is extended or adjusted under 35 U.S.C. 154(b) by 27 days.

(21) Appl. No.: 15/643,174

(22) Filed: Jul. 6, 2017

(65) Prior Publication Data

US 2018/0179049 A1 Jun. 28, 2018

Related U.S. Application Data

(60) Provisional application No. 62/439,242, filed on Dec. 27, 2016.

(51) Int. Cl.
*B81B 3/00* (2006.01)
*B81C 1/00* (2006.01)
(Continued)

(52) U.S. Cl.
CPC .......... *B81B 3/0051* (2013.01); *B81B 3/0059* (2013.01); *B81C 1/0038* (2013.01); *H01L 29/84* (2013.01); *H01L 41/113* (2013.01); *B81B 2201/0228* (2013.01); *B81B 2201/0235* (2013.01); *B81B 2201/0242* (2013.01); *B81B 2203/04* (2013.01); *B81C 2201/0181* (2013.01);
(Continued)

(58) Field of Classification Search
CPC ............. H01L 29/84; H01L 2924/1461; H01L 41/113; H01L 41/1132; B81B 3/0051; B81B 3/0059; B81B 2201/0228; B81B 2201/0235; B81B 2201/0242
USPC .................................................. 257/417, 420
See application file for complete search history.

(56) References Cited

U.S. PATENT DOCUMENTS 6,282,958 B1  9/2001  Fell et al.
7,100,446 B1  9/2006  Acar et al.
(Continued)

FOREIGN PATENT DOCUMENTS

EP       2690400 A2    1/2014
JP    2009130445 A    6/2009
(Continued)

OTHER PUBLICATIONS

Great Britain Intellectual Property Office, "Combined Search and Examination Report under Sec. 17 and 18(3)", Apr. 20, 2018, pp. 1-9, South Wales.
(Continued)

*Primary Examiner* — Matthew E Warren
(74) *Attorney, Agent, or Firm* — Fogg & Powers LLC

(57) ABSTRACT

A micro-electro-mechanical systems (MEMS) device and method of fabricating the MEMS device are disclosed. The MEMS device comprises a substrate, one or more suspension structures connected to the substrate, one or more metallized layers on the one or more suspension structures, and one or more sense structures connected to the one or more suspension structures. The one or more metallized layers provide selectively adjusted damping of the one or more suspension structures.

20 Claims, 23 Drawing Sheets

(51) Int. Cl.
    *H01L 41/113*     (2006.01)
    *H01L 29/84*     (2006.01)

(52) U.S. Cl.
    CPC ... *H01L 41/1132* (2013.01); *H01L 2924/1461* (2013.01)

(56) References Cited

U.S. PATENT DOCUMENTS

| | | | |
|---|---|---|---|
| 7,215,461 | B1 | 5/2007 | Leung et al. |
| 7,258,010 | B2 | 8/2007 | Horning et al. |
| 7,529,154 | B2 | 5/2009 | Cole et al. |
| 7,968,958 | B2 * | 6/2011 | Fujii ............... B81B 7/007 257/415 |
| 8,047,076 | B2 * | 11/2011 | Yoshikawa ......... G01P 15/0802 257/417 |
| 8,643,140 | B2 | 2/2014 | Yang |
| 2013/0205898 | A1 | 8/2013 | Nakagawa |
| 2013/0255379 | A1 * | 10/2013 | Nakagawa ......... G01C 19/5621 73/504.16 |

FOREIGN PATENT DOCUMENTS

| | | |
|---|---|---|
| JP | 2013186029 A | 9/2013 |
| JP | 2014092500 A | 5/2014 |

OTHER PUBLICATIONS

Merz et al., "Combined MEMS Inertial Sensors for IMU Applications", 2010 IEEE 23rd International Conference on Micro Electro Mechanical Systems (MEMS), Jan. 24-28, 2010, pp. 488-491, Publisher: IEEE, Published in: Wanchai, Hong Kong, China.

Reimer et al., "Dual pressure chip capping technology", Paper ID: 1983144 Session 10: MEMS Packaging, Sep. 20, 2010, pp. 1-20, Publisher: Fraunhofer-Institut fur Siliziumtechnologi, Published in: Itzehoe, Germany.

Yoon et al., "Shock-Protection Improvement Using Integrated Novel Shock-Protection Technologies", Journal of Microelectromechanical Systems, Aug. 2011, pp. 1016-1031, vol. 20, No. 4, Publisher: IEEE.

Great Britain Intellectual Property Office, "Office Action from GB Application No. 1718347.6", from Foreign Counterpart to U.S. Appl. No. 15/643,174, dated Nov. 13, 2019, pp. 1-3, Published: GB.

* cited by examiner

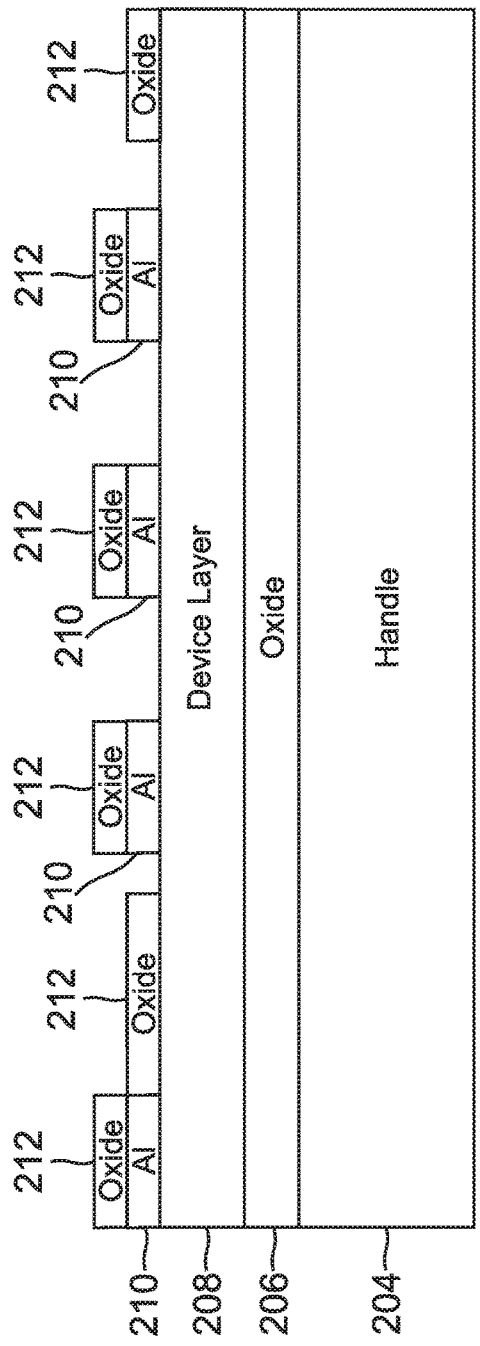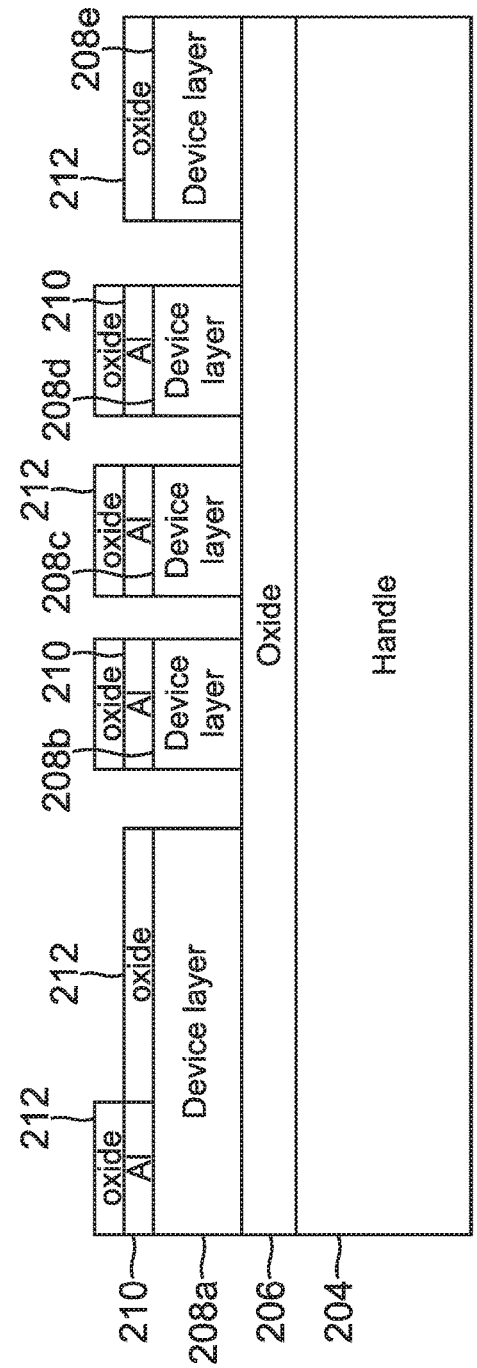

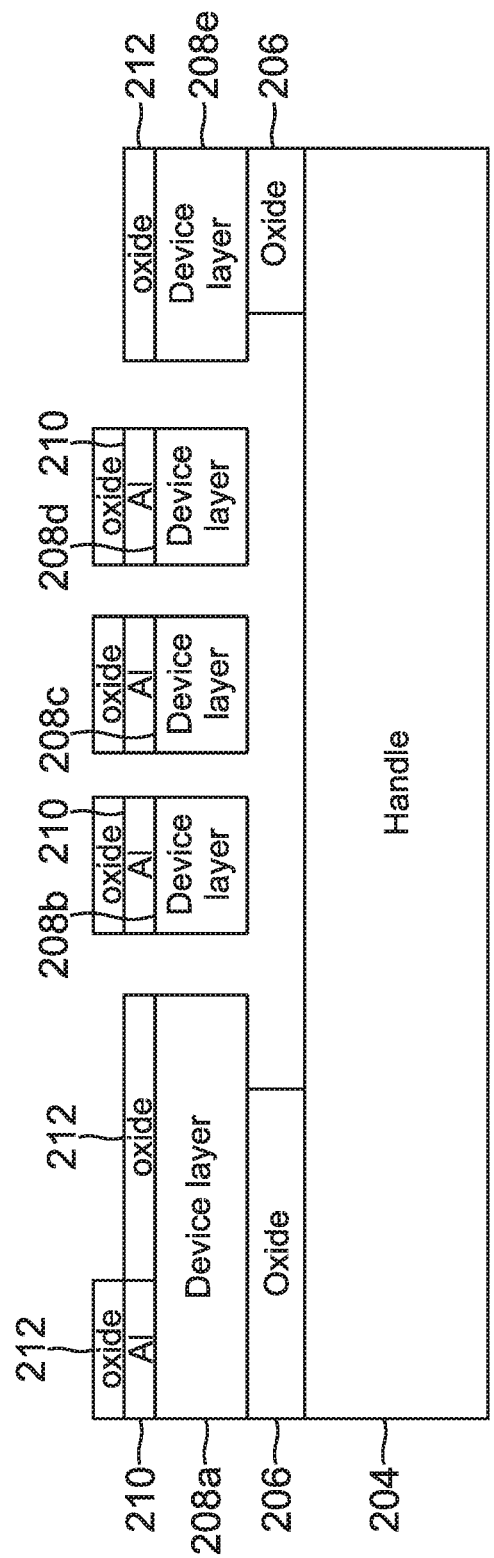

ured damping of suspensions, and a
MEMS SENSORS WITH SELECTIVELY ADJUSTED DAMPING OF SUSPENSION

CROSS REFERENCE TO RELATED APPLICATION

This application claims the benefit of priority to U.S. Provisional Application No. 62/439,242, filed on Dec. 27, 2016, which is herein incorporated by reference.

BACKGROUND

When micro-electro-mechanical systems (MEMS) inertial sensors are subject to external forces, functionality may be lost and/or performance may be compromised. A typical approach in MEMS gyroscopes for reducing susceptibility towards vibration is to use a tuning fork architecture, which features two proof masses that are driven with opposite phase. However, there is also an in-phase mode, sometimes called "hula" mode, which is sensitive towards vibration. The in-phase mode can be actuated by random vibration or by mechanical shock, and if the quality factor (Q-factor) is high, the deflection can be significant. There is also a complementary mode of the sense mode (out-of-phase mode) called trampoline (in-phase mode) which is also sensitive towards vibration. By reducing the Q-factor of the hula mode and/or the trampoline, and keeping the same Q-factor for both operation modes (drive and sense), the performance of the gyroscope should not be changed but the immunity towards vibration should increase.

There have been various approaches to address how to reduce vibration of MEMS sensors, such as by including material based on a thin film located between the die with the structure and the package. Nonetheless, this approach requires manufacturing of a sophisticated stack of different thin films and integration with the die. Moreover, this approach also increases the size of the entire package and can cause problems with outgassing if the integration is not with wafer-level packaged devices.

The adjustment of bandwidth for gyroscopes has been addressed in another approach, in which the bandwidth was achieved by using multiple resonators having different resonance frequencies. By summing the response of such resonators, a wide bandwidth response has been achieved.

In addition, the integration of different sensors, such as accelerometers and gyroscopes, within a single package has been disclosed. This approach uses different cavities with different pressures for fabrication of the sensors. This approach, however, uses a combination of getterable and notable gases, which limits the pressure difference between an accelerometer and gyroscope. The accelerometer requires high pressure, therefore, there must be a high content of gas during packaging, and the amount of getterable gas that can be absorbed is limited by area of the getter, resulting in a limited ratio between the pressures.

SUMMARY

A micro-electro-mechanical systems (MEMS) device and method of fabricating the MEMS device are disclosed. The MEMS device comprises a substrate, one or more suspension structures connected to the substrate, one or more metallized layers on the one or more suspension structures, and one or more sense structures connected to the one or more suspension structures. The one or more metallized layers provide selectively adjusted damping of the one or more suspension structures.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which:

FIGS. 2A-2E are cross-sectional end views showing an exemplary method of fabricating a MEMS device, in which suspension structures are formed with metallized layers for selectively adjusted damping;

DETAILED DESCRIPTION

Figure 1A:
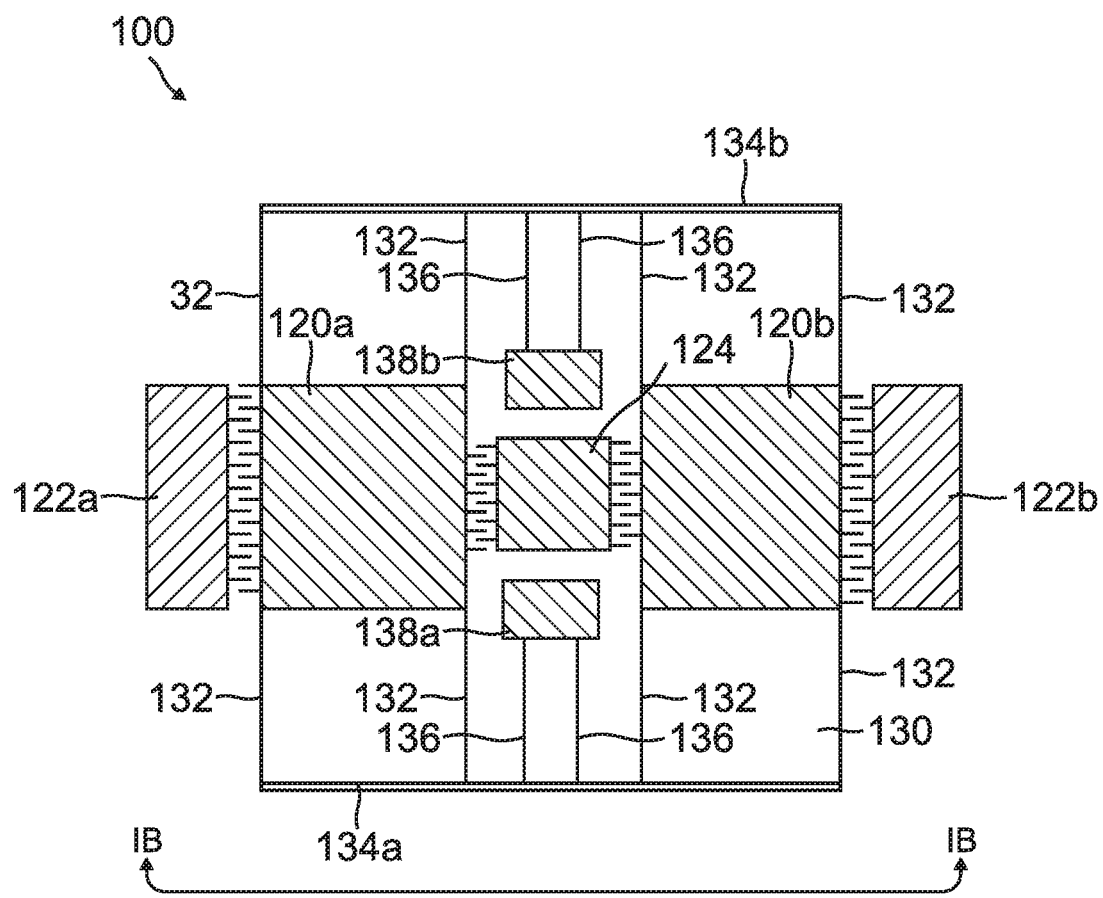
FIG. 1A is a plan view of a micro-electro-mechanical systems (MEMS) gyroscope according to one embodiment, which can have suspension structures with selectively adjusted damping.

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

The present disclosure is directed to micro-electro-mechanical systems (MEMS) devices such as MEMS sensors that have selectively adjusted damping of suspensions, and methods of fabricating such MEMS devices. The present approach improves vibration damping, thereby providing increased robustness for MEMS sensors. Furthermore, the present approach improves sensitivity for MEMS sensors while accommodating sensors with different Q-factors. These improvements are realized by adding thin film materials to adjust and tune the damping of the sense mode to optimize the modes for each respective sensor type.

In one embodiment, a MEMS device fabricated according to the present approach includes a substrate, one or more suspension structures connected to the substrate, and one or more MEMS sense structures connected to the suspension structures. The suspension structures include one or more metallized layers that provide selectively adjusted damping of the suspension structures.

The present approach addresses various issues with respect to performance of MEMS sensors. These include unwanted motion of MEMS sensors, namely motion caused by vibration and mechanical shocks; an increase in sensitivity of MEMS sensors such as gyroscopes; and the integration of multiple sensors that require a different Q-factor (bandwidth), for example, accelerometer and gyroscope, or low and high bandwidth gyroscopes, within one hermetically sealed wafer level package.

The bandwidth of a gyroscope is controlled by the separation between drive and sense modes, which is known as "split mode" operation. A gyroscope can also be operated in a "match mode" which offers high sensitivity. Nonetheless, the bandwidth for this configuration is defined by the damping of the sense mode. Typically, this bandwidth can be as low as one hertz. Therefore, by adjusting damping of the sense mode only, high sensitivity and adequate bandwidth can be achieved. Moreover, the adjustment of the damping can be achieved by adding materials that collect charge under mechanical stress (e.g., piezoelectric materials). By collecting charge from those materials when under deformation, better sensitivity can be reached.

When multiple inertial sensors that require different bandwidths are integrated, there is a need for different damping. By adjusting damping of MEMS structures, different sensors can be integrated within the very same package, thus saving space and cost for integration if multiple dies/packages are used.

The present method uses a thin film material that is formed (e.g., evaporated or sputtered) selectively onto a MEMS structure. The damping of the thin film material can be by several orders of magnitude higher than that of pure crystalline silicon, which is a material of choice for MEMS manufacturing of high Q resonators. The thin film material formation can be done on beams of the MEMS structure that are deflected under motion caused by vibration if lower vibration sensitivity is sought.

In one embodiment, the adjustment of sense bandwidth can be achieved by forming a thin film material on a suspension of the MEMS structure, which is primarily deformed under Coriolis force. By not adjusting the suspension, which is deformed under motion of the primary drive, the Q-factor of the drive (primary mode) is unchanged. By operating a gyroscope with increased damping of the sense mode in mode-match or close mode-match, sensitivity can be increased and the bandwidth should be increased (as compared to gyroscopes without adjusted damping).

The present approach also enables the use of two gyroscopes within one package that have different sensitivity and damping. For example, one gyroscope with adjusted damping of the sense suspension can be operated in a mode-match configuration with lower bandwidth and higher sensitivity, and the other gyroscope without adjusted damping can be operated in split mode with higher bandwidth but lower sensitivity. In addition, the reduction of damping can be done on individual structures (suspensions) and therefore there is no need to introduce different packages and/or cavities within one wafer level package.

A typical MEMS gyroscope tuning fork architecture has two proof masses that are driven in opposite phase at the drive frequency. The proof masses can also be driven with the same phase at different frequency than drive (hula mode). Because both proof masses move with the same phase, the motion can be caused by vibration or mechanical shock. By designing a gyroscope where different parts of the suspension undergoes deflection when actuated by in-phase (vibration) or out-of-phase (electrostatic drive) force, different damping for both modes can be achieved.

In one exemplary method, the adjustment of damping is done by applying and developing photoresist on the parts of a suspension structure primarily deflected by vibration. The deposition (sputtering or evaporation) of the thin film metal can take place before release of the structure, assuming that the release of the sacrificial layer does not significantly alter the metallization. Ideally, this step is combined with metallization of electrical contacts. Nonetheless, the adjustment of damping will likely result in an extra manufacturing step, and the exact procedure will depend on the manufacturing used for the sensor itself. The same approach can also be used for other modes in which damping needs to be altered (e.g., in-phase sense mode/trampoline mode or sense mode).

When a gyroscope has separate suspensions for sense and drive, by depositing the thin film on the sense suspension and operating the gyroscope in a mode-match configuration, higher performance can be achieved (both bandwidth and sensitivity). Nonetheless, there may be a trade-off between mechanical noise (angle random walk, ARW), which is proportional to the damping of sense mode, mechanical gain, and bandwidth.

Further details of various embodiments are described hereafter with reference to the drawings.

Figure 1B:
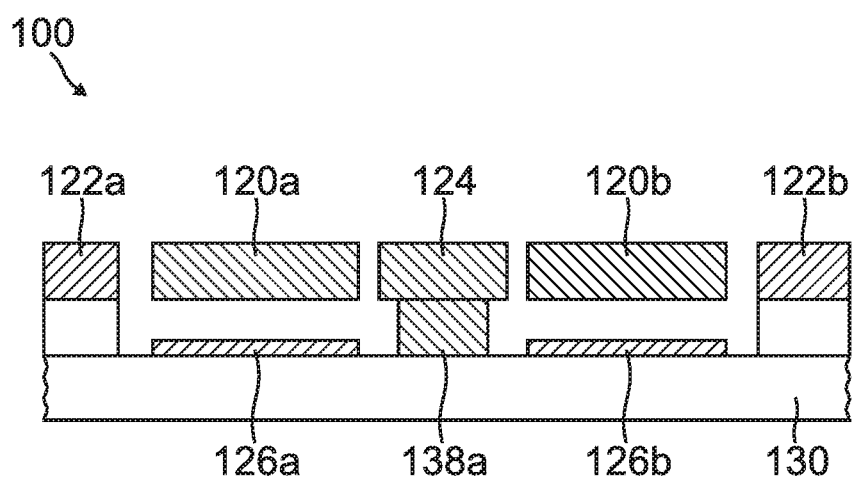
FIG. 1B is an end view of the MEMS gyroscope of FIG. 1A.

FIGS. 1A and 1B illustrate a typical MEMS gyroscope 100 based on a tuning fork architecture, to which the present damping adjustment approach can be applied, for example. The MEMS gyroscope 100 includes two proof masses 120a, 120b, in which oscillating (driving) is implemented out-of-phase in-plane, and readout is implemented out-of-phase out-of-plane. A pair of drive combs 122a, 122b are each respectively adjacent to proof masses 120a, 120b and generate the electrostatic force to drive MEMS gyroscope 100. A pick-off comb 124 is located between proof masses 120a, 120b and measures the charge (current) generated by in-plane out-of-phase motion (drive mode) of the mechanical structure of MEMS gyroscope 100. A pair of sense electrodes 126a, 126b (FIG. 1B) are located under proof masses 120a, 120b and measure the charge (current) generated by out-of-plane motion of the mechanical structure of MEMS gyroscope 100. The various structures of MEMS gyroscope 100 are supported on a substrate 130. The substrate 130 is typically silicon, but other materials can be used such as glass (e.g., Pyrex).

The components of MEMS gyroscope 100 are connected to substrate 130 through various suspension structures. For example, a set of drive suspensions 132 connect proof masses 120a, 120b to a pair of opposing base suspensions 134a, 134b, which in turn are connected to a set of anchor suspensions 136. The anchor suspensions 136 are respectively connected to a pair of anchors 138a, 138b, which are coupled to substrate 130.

The various suspension structures can be formed with metallized layers for selectively adjusted damping. Examples of metals that can be used for the metallized layers include platinum, titanium, zinc, aluminum, copper, nickel, silver, gold, chromium, molybdenum, or combinations thereof.

Figure 2A:
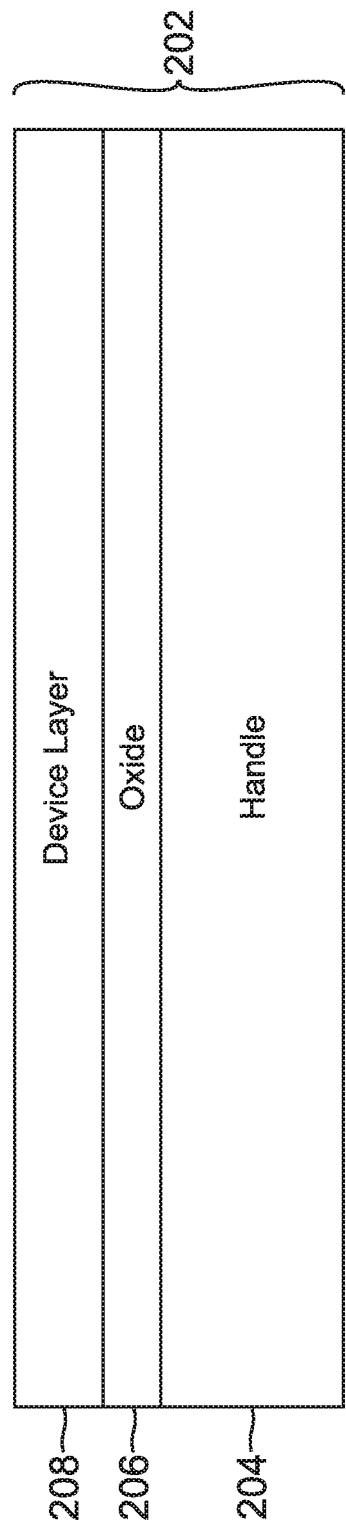

FIGS. 2A-2E are cross-sectional end views showing an exemplary method of fabricating a MEMS device, in which suspension structures are formed with metallized layers for selectively adjusted damping. Fabrication of the MEMS device begins with providing a wafer 202, as shown in FIG. 2A. The wafer 202 includes a handle layer 204, an oxide layer 206 formed over handle layer 204, and a device layer 208 formed over oxide layer 206. In one embodiment, wafer 202 can be a crystalline silicon on insulator (SOI) wafer, with a given thickness for handle layer 204 and device layer 208, which are formed of silicon, with oxide layer 206 being a buried oxide (BOX) layer.

Figure 2B:
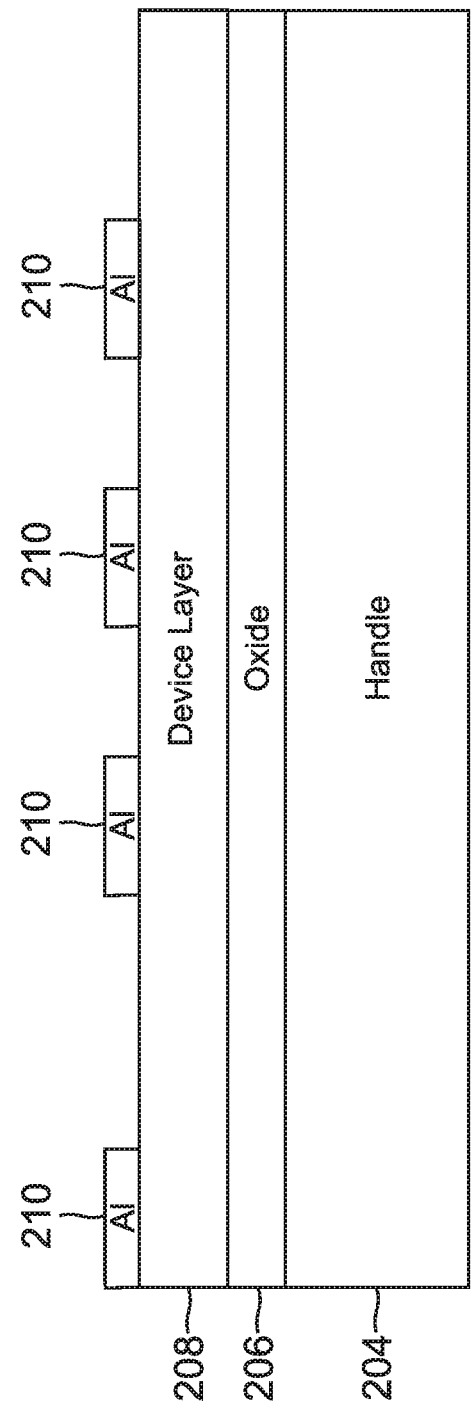

As shown in FIG. 2B, metal layers 210 (e.g., aluminum) are deposited selectively over device layer 208, such as by a lithographic process (e.g., lift-off). The deposition of metal layers 210 can be done by physical vapor deposition (PVD) such as sputtering or evaporation, for example. This step can be easily integrated into many current processes, since metallization is used to define bond pads to electrically route electrical signals out of the MEMS device. The thickness of metal layers 210 can be varied to provide selectively adjusted damping of the MEMS device.

For example, the thickness of the deposited metal layers can be in a range of tens of nanometers up to several micrometers, resulting in a deposition range ratio (thickness of deposited metal layer with respect to thickness of suspension) of about 1:100 to about 1:10 (e.g., thickness of about 20 μm of structural suspension material assumed). Alternatively, the suspension material can be made thinner, as described for example in U.S. Pat. No. 7,258,010, the disclosure of which is incorporated by reference.

A mask layer 212 is then deposited over metal layers 210 and the exposed surface of device layer 208, as depicted in FIG. 2C. The mask layer 212 can be formed with a plasma enhanced chemical vapor deposition (PECVD) oxide, for example. The mask layer 212 is formed with openings for performing etching, such as deep reactive ion etching (DRIE).

Next, the etching is performed, such as DRIE, to form device layer structures 208a-208e, as illustrated in FIG. 2D. The etching exposes upper surfaces of oxide layer 206, which will be used as a sacrificial oxide. This step is shown in FIG. 2E, in which the sacrificial oxide is removed, such as by hydrofluoric (HF) acid (e.g., 49%). In case the deposited metal layers are not protected by oxide, the metal layers must be HF tolerant (e.g., gold, nickel, molybdenum), or a specific HF solution needs to be used that has a low etch rate for a particular metal (e.g., buffered hydrofluoric acid (BHF) has an etching rate of 135:3, $SiO_2$:Al).

A similar approach can be used for surface manufacturing, in which the metallization is done after polysilicon deposition and polishing.

Figure 3:
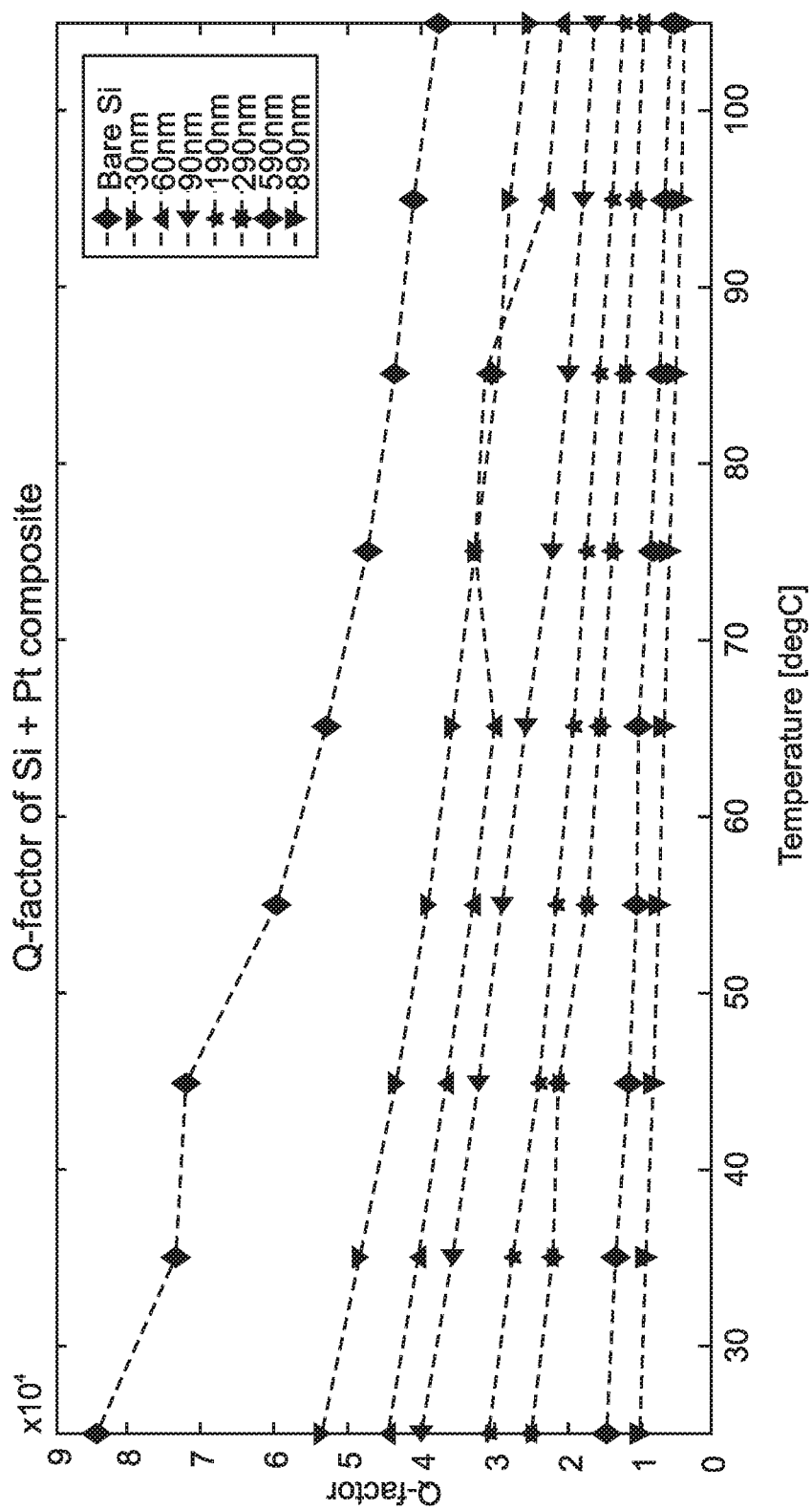
FIGS. 3 and 4 are graphs of Q-factor with respect to temperature for silicon/platinum and silicon/titanium composites.
Figure 4:
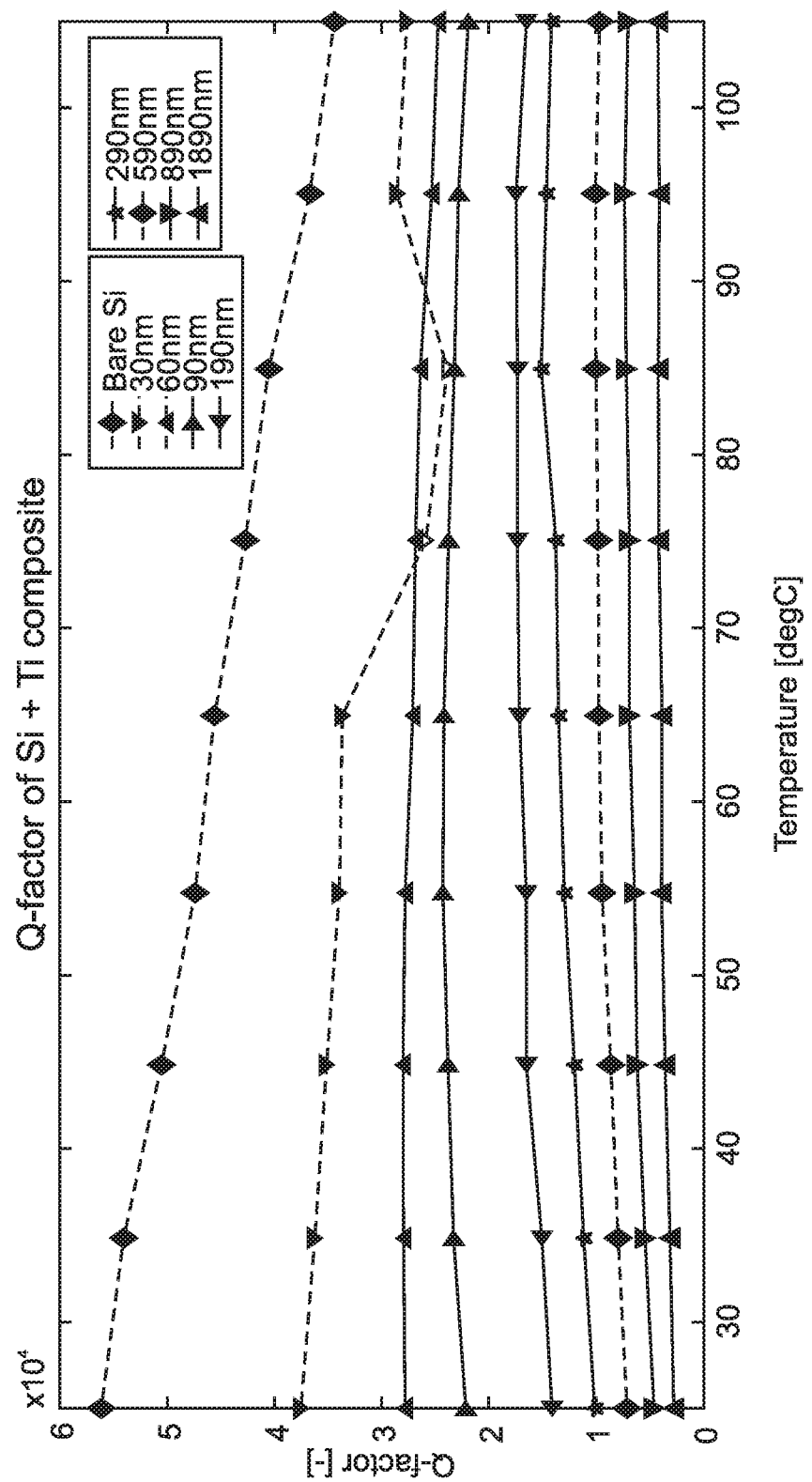

FIGS. 3 and 4 are graphs of Q-factor with respect to temperature for silicon/platinum and silicon/titanium composites. FIGS. 3 and 4 show the change of Q-factor (damping) for a silicon cantilever—free/fixed beam (1650 μm length, 20 μm thickness, 50 μm width) as a function of thin film thickness and temperature (covering most of the application temperature range) for platinum (FIG. 3) and titanium (FIG. 4) thin films. The thin films were applied to the entire structure at the given thickness.

Figure 5:
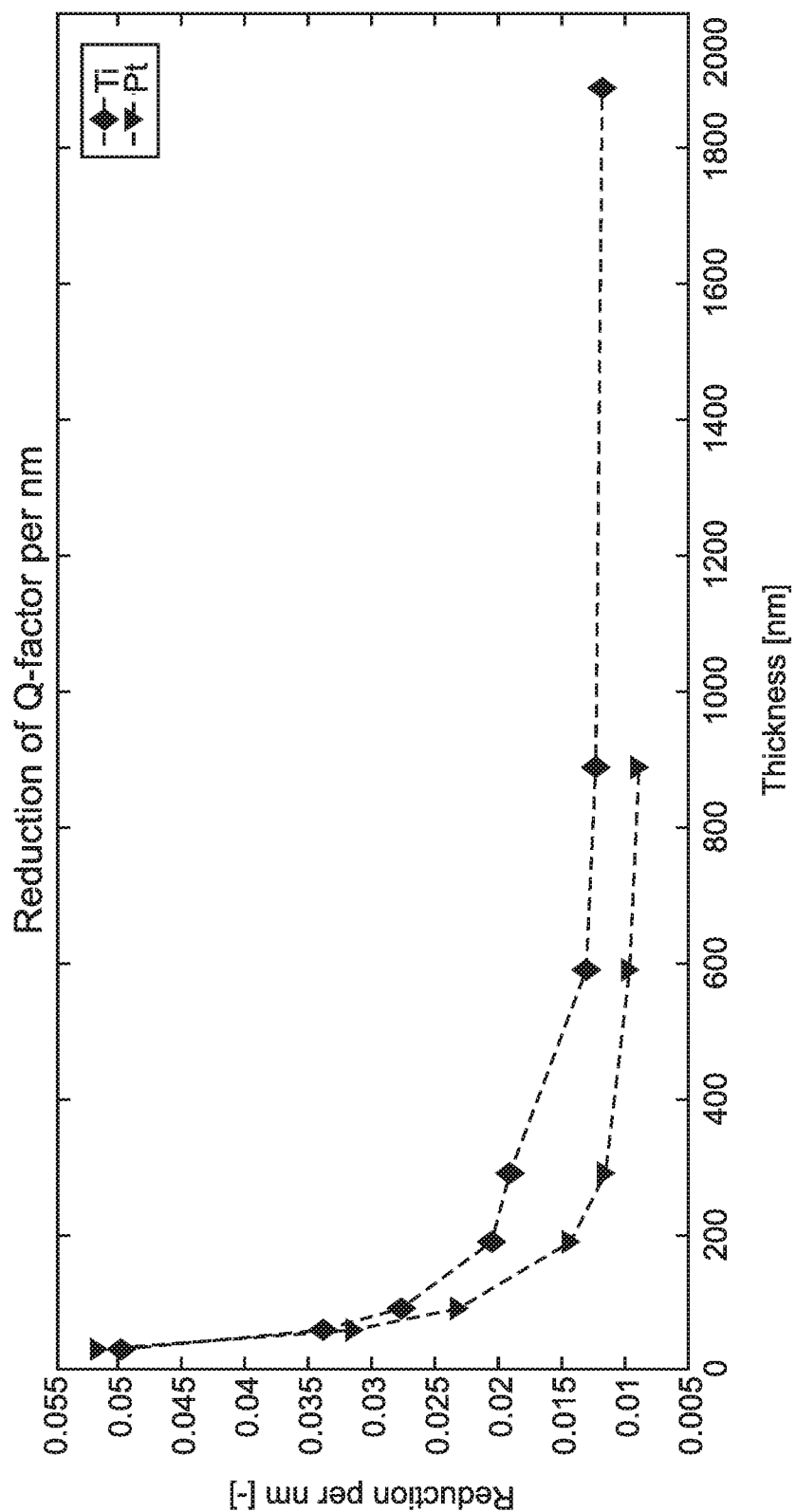
FIGS. 5 and 6 are graphs showing damping reduction as a function of thin film thickness.
Figure 6:
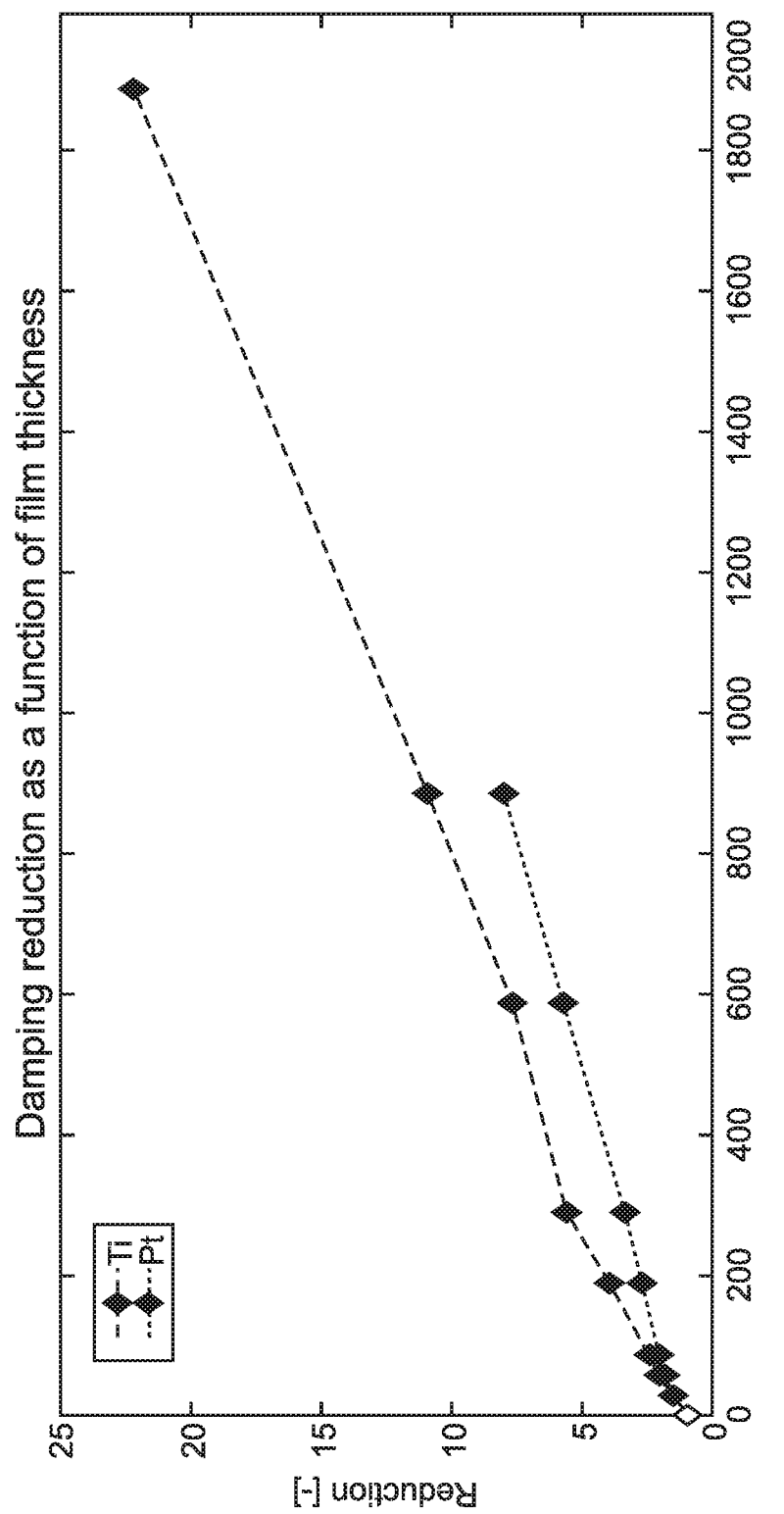

FIGS. 5 and 6 are graphs showing damping reduction as a function of thin film thickness. FIG. 5 shows the reduction of Q-factor per nm as a function of thin film thickness, while FIG. 6 shows the damping reduction as a function of thin film thickness. It is clear from FIGS. 5 and 6 that the reduction per nm of thin film thickness reduces sharply up to the point of around 600 nm. Consequently, the thickness of the thin film would likely be around 600 nm for maximal reduction/needed material.

Figure 7:
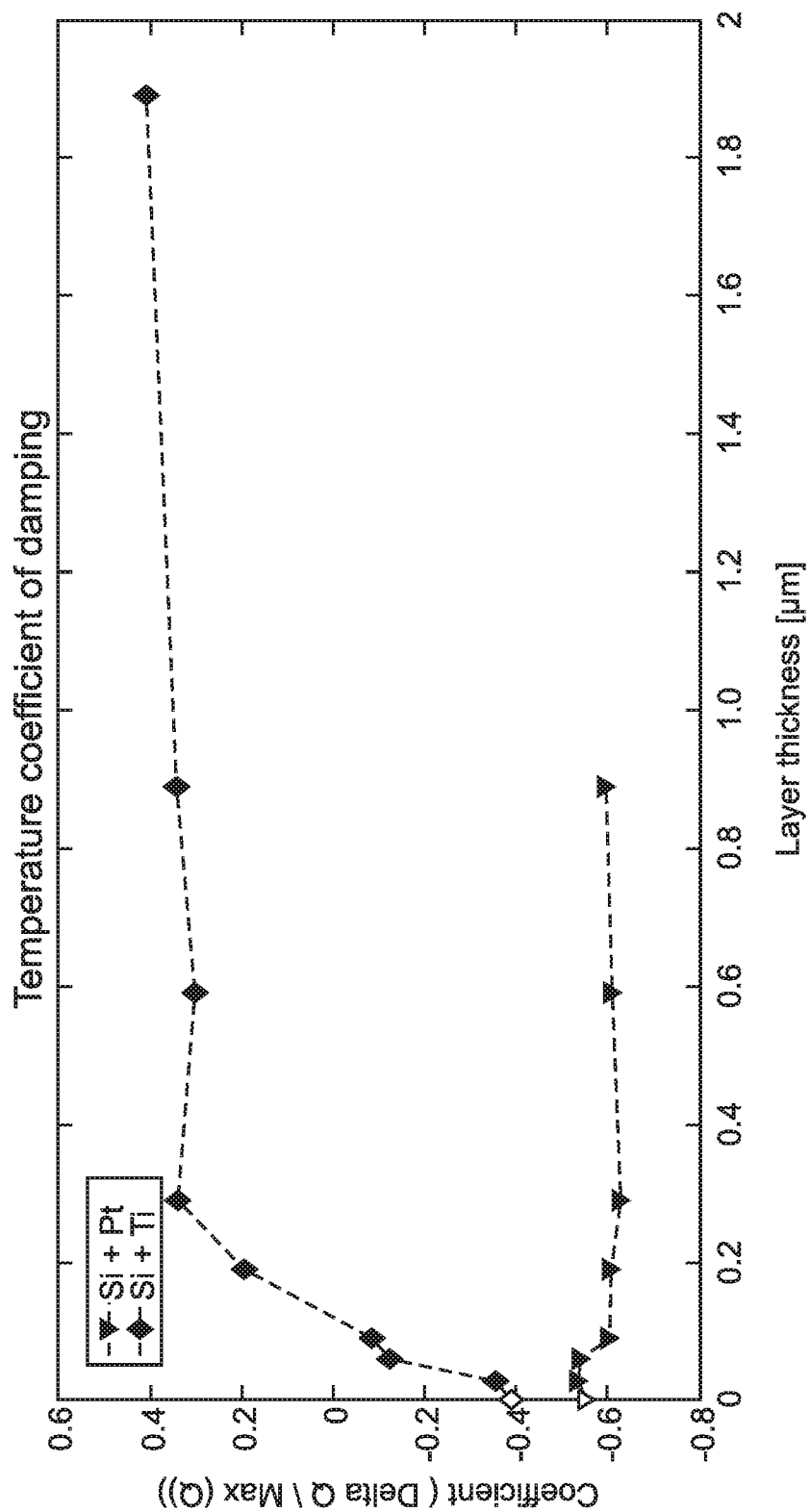
FIG. 7 is a graph of the temperature coefficient of damping for platinum and titanium thin films on silicon.

Experiments have shown a change of temperature coefficient for damping (change of damping as a function of change of temperature). The dependence of the coefficient is shown in the graph of FIG. 7 for platinum and titanium thin films on silicon. As indicated in the graph of FIG. 7, the dependence of the coefficient differs for platinum and titanium.

Figure 8:
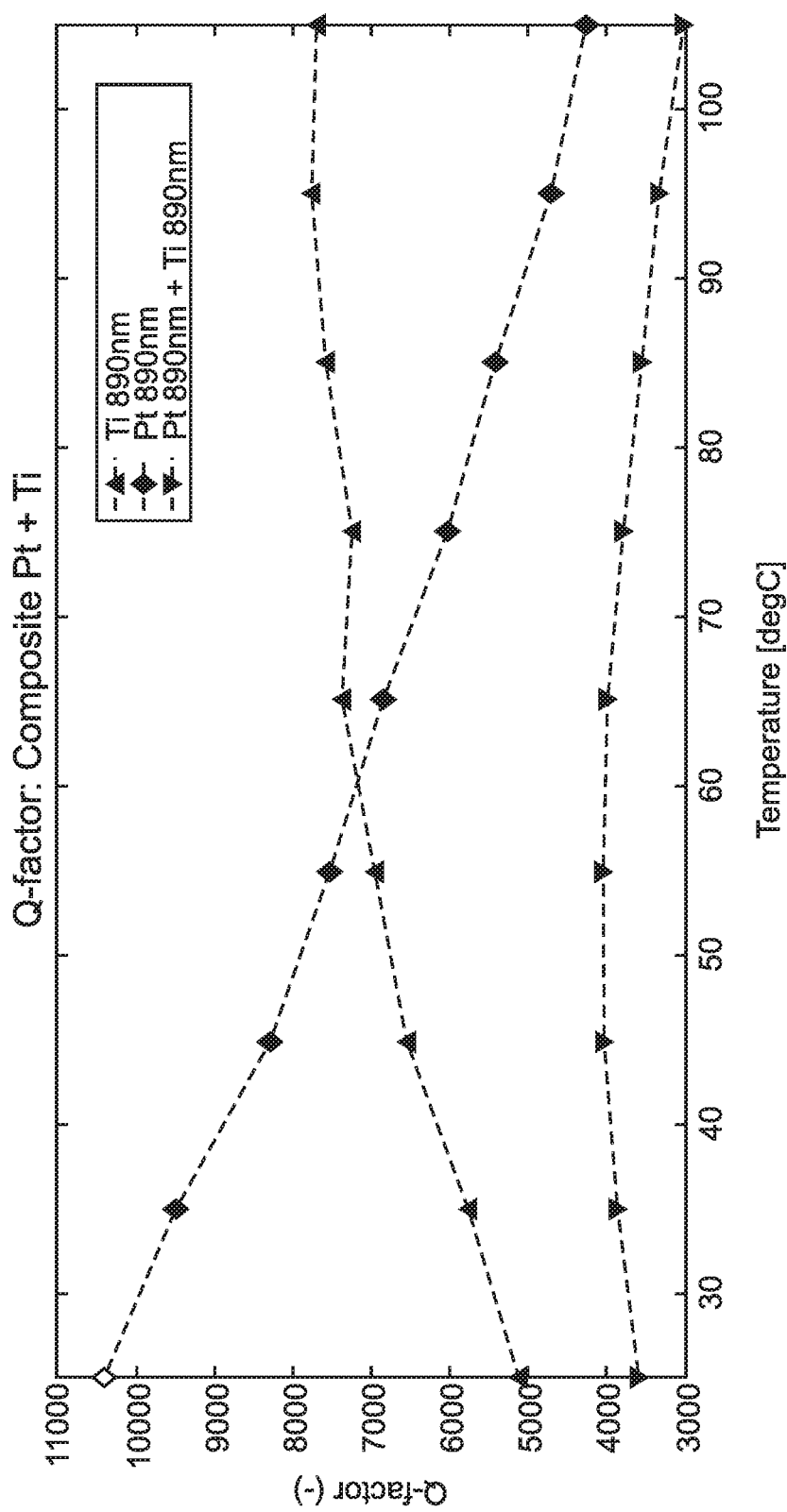
FIG. 8 is a graph of Q-factor with respect to temperature for a platinum and titanium composite resonator.

By applying both platinum and titanium, a composite resonator with better temperature stability can be realized. The graph of FIG. 8 shows the improvement by applying 890 nm of platinum and 890 nm of titanium. Originally, the damping was changed from 84,000 (maximal) down to 38,000 (minimal) when only crystalline Si was used corresponding to 45% relative change. By applying platinum and titanium as a composite thin film, a change in damping from 4000 down to 3000 was achieved resulting in a 25% change. By using combinations of different materials, even better results may be achieved.

Figure 9:
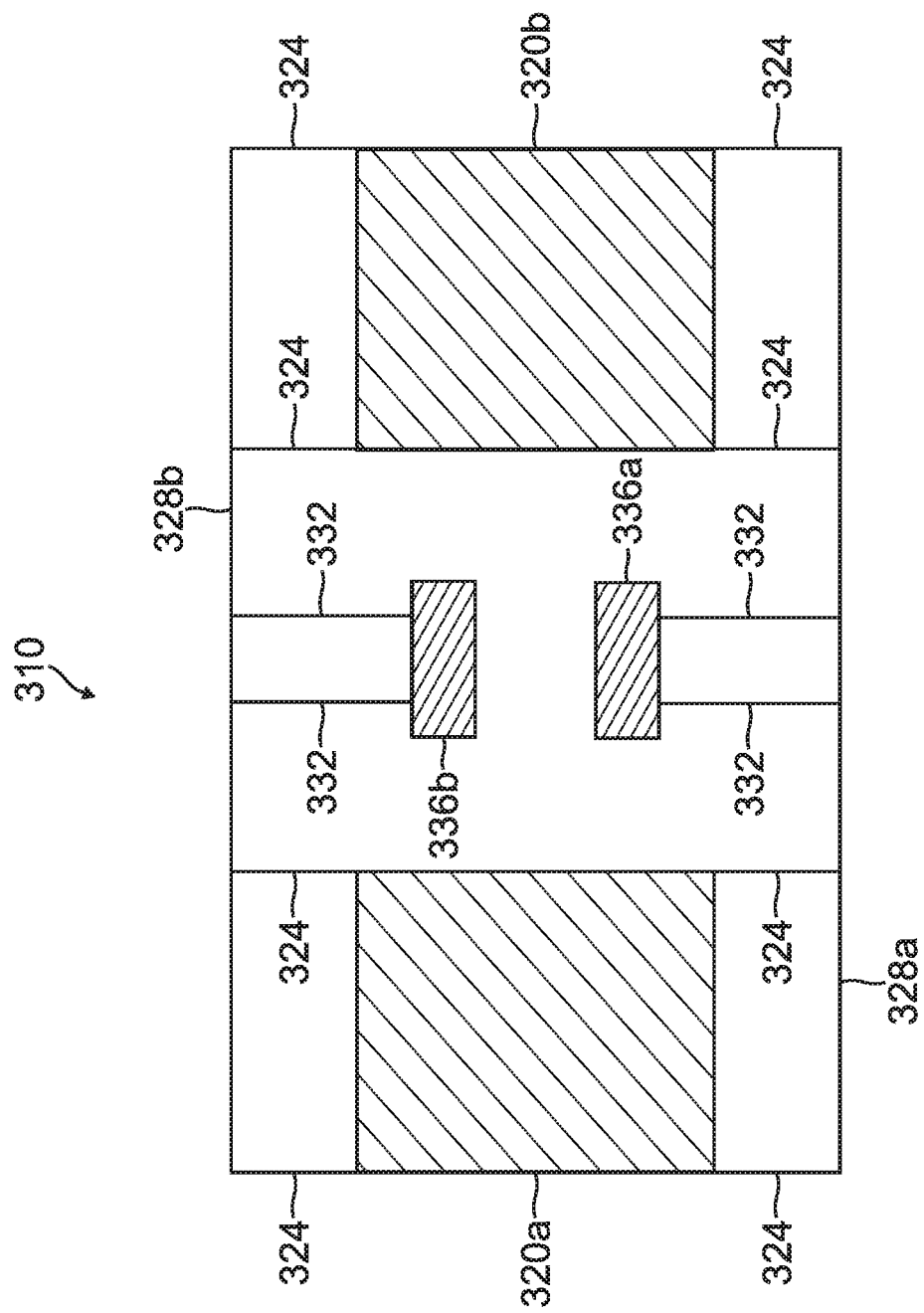
FIG. 9 is a plan view of a general depiction of a MEMS gyroscope.

In one implementation, adjustment of unwanted (vibration sensitive) modes can be carried out by the present approach for a MEMS device, such as a MEMS gyroscope 310, which is generally depicted in FIG. 9. The MEMS gyroscope 310 includes a pair of proof masses 320a, 320b. A set of drive suspensions 324 connect proof masses 320a, 320b to a pair of opposing base suspensions 328a, 328b, which in turn are connected to a set of anchor suspensions 332. The anchor suspensions 332 are respectively connected to a pair of anchors 336a, 336b.

Figure 10A:
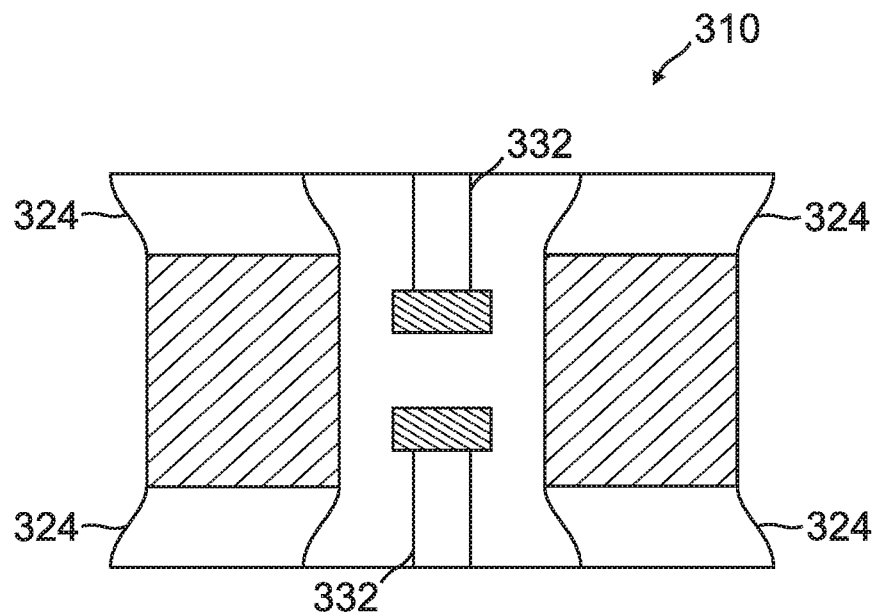
FIG. 10A is a plan view showing a typical deformation for an operational mode of the MEMS gyroscope of FIG. 9.
Figure 10B:
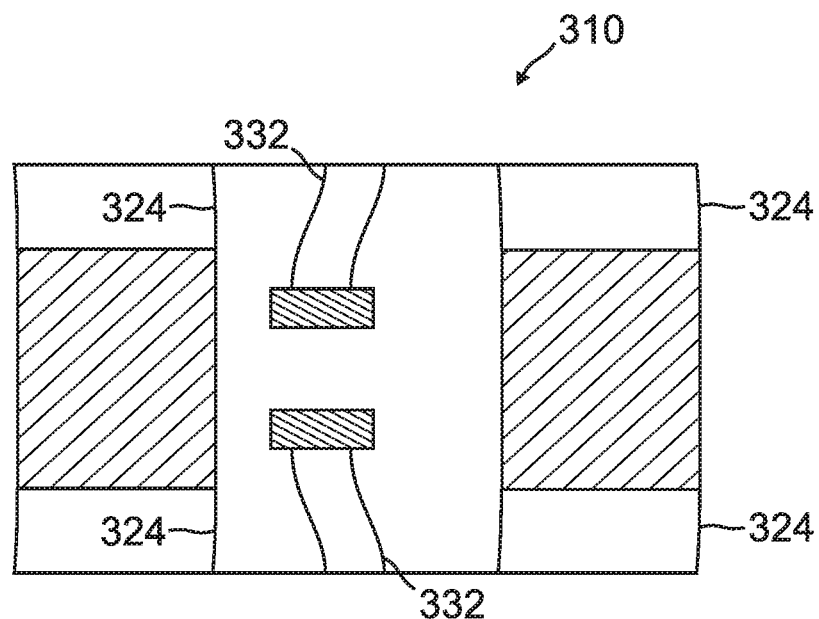
FIGS. 10B and 10C are respectively a plan view and an isometric view, which show a typical deformation for a hula mode of the MEMS gyroscope of FIG. 9.
Figure 10C:
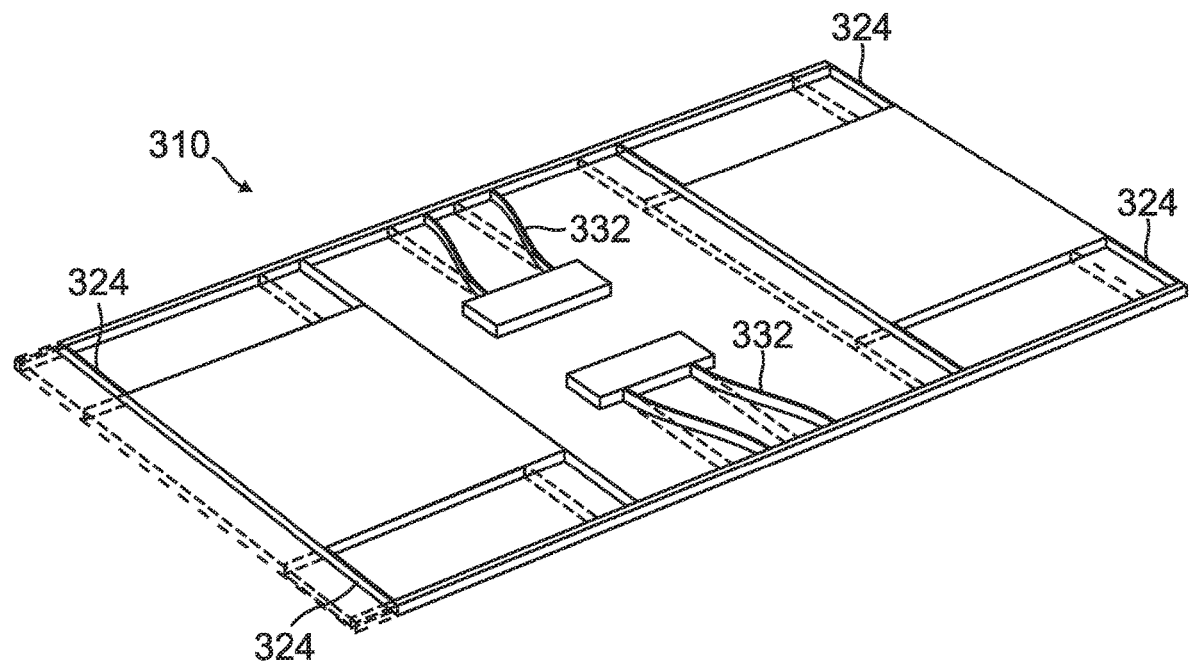

FIG. 10A illustrates a typical deformation for an operational mode (drive) of MEMS gyroscope 310. FIGS. 10B and 10C illustrate a typical deformation for a hula mode of MEMS gyroscope 310. By deposition of a thin film on anchor suspensions 332 to increase their damping, and keeping the damping of drive suspensions 324 unchanged, reduced deflection of the proof masses under mechanical shock and vibration can be realized.

Figure 11:
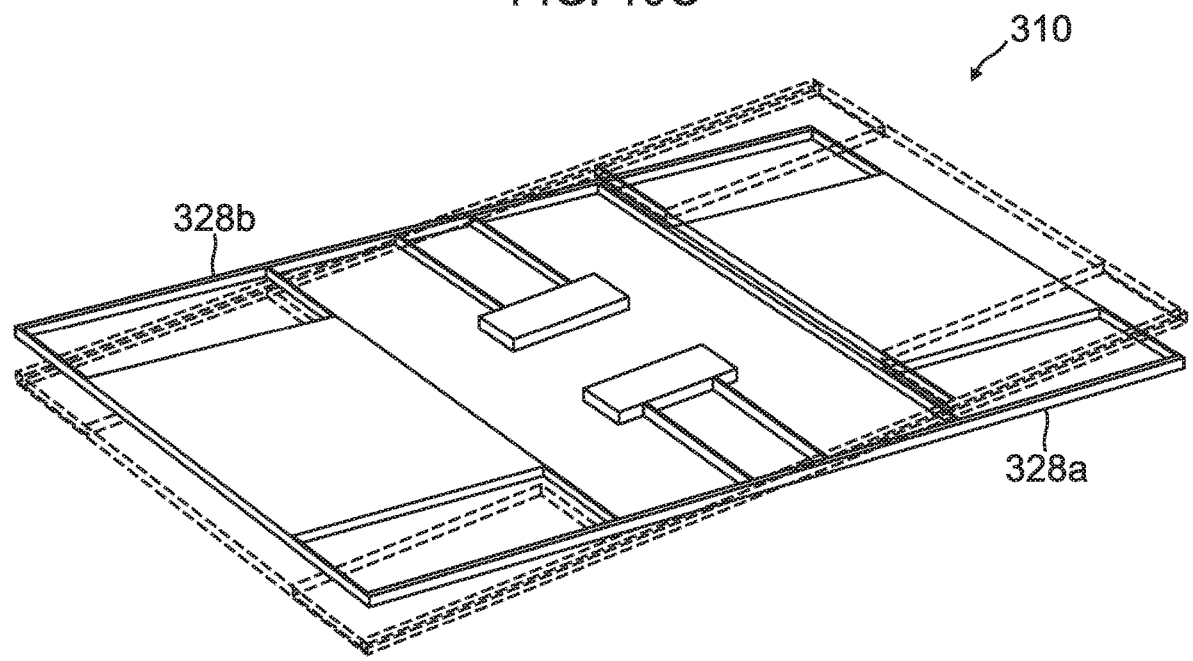
FIG. 11 is an isometric view showing a typical deformation for a sense mode of the MEMS gyroscope of FIG. 9.

In another implementation, an increase of bandwidth and reduced sensitivity to environmental conditions for a mode match of a MEMS device, such as MEMS gyroscope 310, can be realized by the present approach. FIG. 11 depicts a typical deformation for a sense mode of MEMS gyroscope 310. By deposition of a thin film on base suspensions 328a, 328b of MEMS gyroscope 310, the sense mode can be affected.

Further, an alternative approach to multi cavity wafer level integration can be provided by the present technique, which can be used in adjusting the suspensions of MEMS devices.

Figure 12:
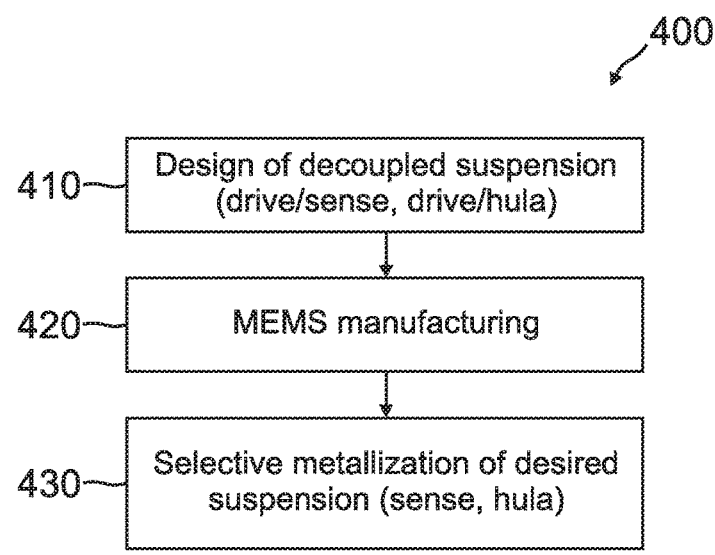
FIG. 12 is a flow diagram of a method for the design and manufacture of a MEMS gyroscope with adjusted damping of suspension.

FIG. 12 is a flow diagram of a method 400 for design and manufacturing of a MEMS gyroscope with adjusted damping of suspension. Initially, the design of a decoupled suspension (drive/sense, drive/hula) is carried out (block 410). The MEMS manufacturing steps are then performed (block 420), along with selective metallization of the desired suspension (sense, hula) (block 430).

Figure 13:
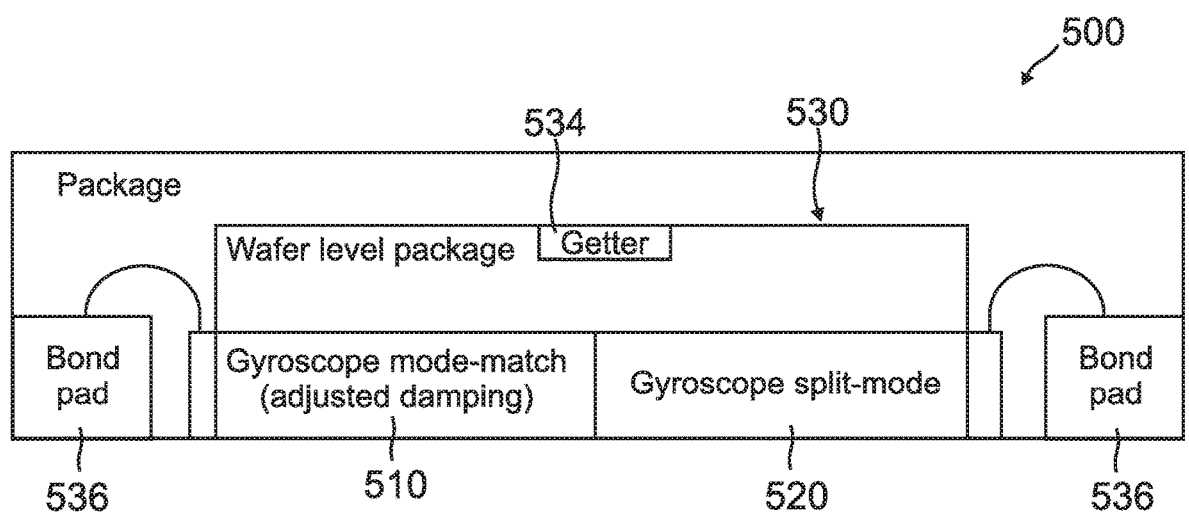
FIG. 13 is a side view showing integration of an adjusted and original MEMS gyroscope in one wafer level package.

The present approach also enables the use of two sensors within one package that have different sensitivity and damping. For example, FIG. 13 illustrates integration in a package 500 of an adjusted gyroscope 510 and an original gyroscope 520 (without adjusted suspension) in one wafer level package 530, according to one embodiment. The gyroscope 510 has adjusted damping of the sense suspension, and can be operated in a mode-match configuration with lower bandwidth and higher sensitivity. The gyroscope 520 can be operated in split mode with higher bandwidth but lower sensitivity. The wafer level package 530 includes a getter 534, and a set of bond pads 536 provide electrical connections for package 500.

Figure 14:
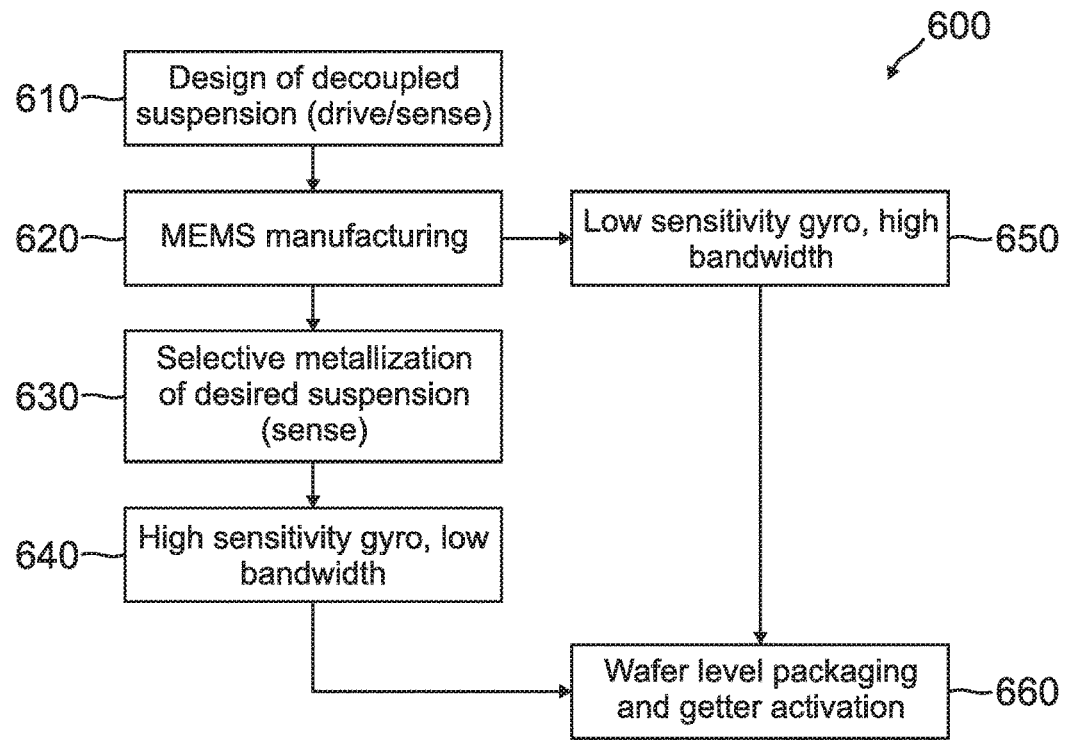
FIG. 14 is a flow diagram of a method for the design and manufacture of MEMS gyroscopes with and without adjusted damping of sense suspensions.

FIG. 14 is a flow diagram of a method 600 for design and manufacturing of MEMS gyroscopes with original and adjusted damping of sense suspensions. Initially, the design of a decoupled suspension (drive/sense) is carried out (block 610). The MEMS manufacturing steps are then performed (block 620). Selective metallization of the desired suspension (sense) (block 630) is used to produce a high sensitivity gyroscope, with low bandwidth (block 640). A low sensitivity gyroscope, with high bandwidth is also produced (block 650). The two gyroscopes are fabricated in wafer level packaging and getter activation is provided (block 660).

Figure 15:
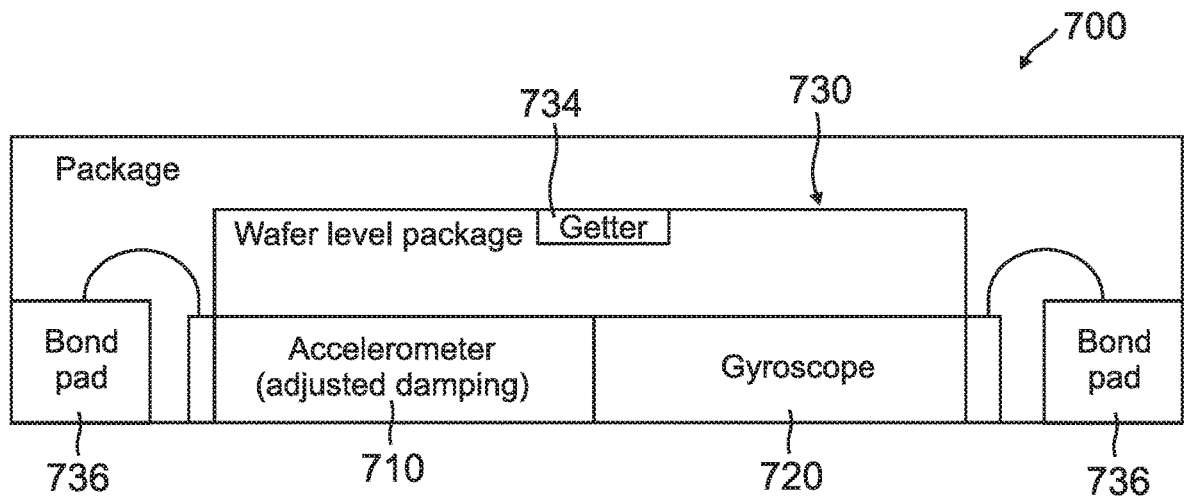
FIG. 15 is a side view showing integration of an accelerometer with adjusted damping of suspensions, and a gyroscope without adjusted damping, in one wafer level package.

FIG. 15 illustrates integration in a package 700 of an accelerometer 710 with adjusted damping of suspension, and a gyroscope 720 (without adjusted suspension) in one wafer level package 730, according to another embodiment. The wafer level package 730 includes a getter 734, and a set of bond pads 736 provide electrical connections for package 700.

Figure 16:
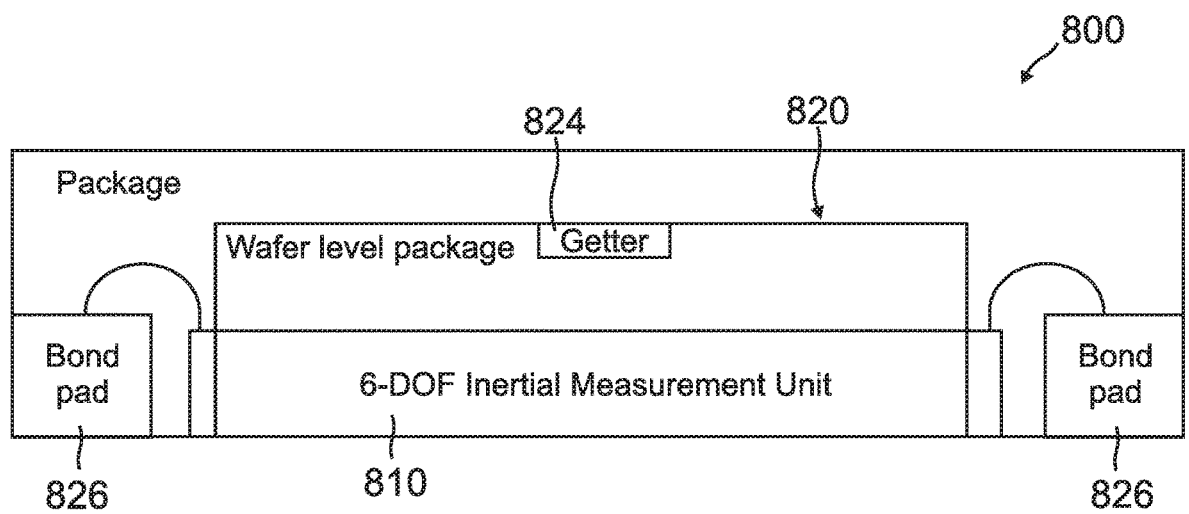
FIG. 16 is a side view showing integration of an inertial measurement unit in one wafer level package.

FIG. 16 shows integration in a package 800 of a complete inertial measurement unit (IMU) 810 with six degrees of freedom (6-DOF), in one wafer level package 820, according to a further embodiment. The IMU 810 includes adjusted and unadjusted structures of the accelerometers and gyroscopes therein. The wafer level package 820 includes a getter 824, and a set of bond pads 826 provide electrical connections for package 800.

Figure 17:
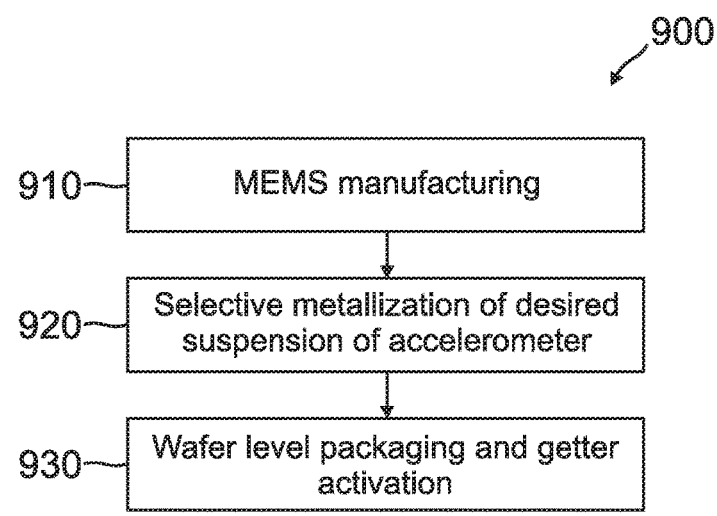
FIG. 17 is a flow diagram of a method for manufacturing and integration of an adjusted accelerometer and gyroscope in one wafer level package.

FIG. 17 is a flow diagram of a method 900 for manufacturing and integration of an adjusted accelerometer and gyroscope in one wafer level package. The MEMS manufacturing steps are performed (block 910), and selective metallization of the desired suspension of the accelerometer is carried out (block 920). The accelerometer and gyroscope are fabricated in wafer level packaging and getter activation is provided (block 930).

Figure 18:
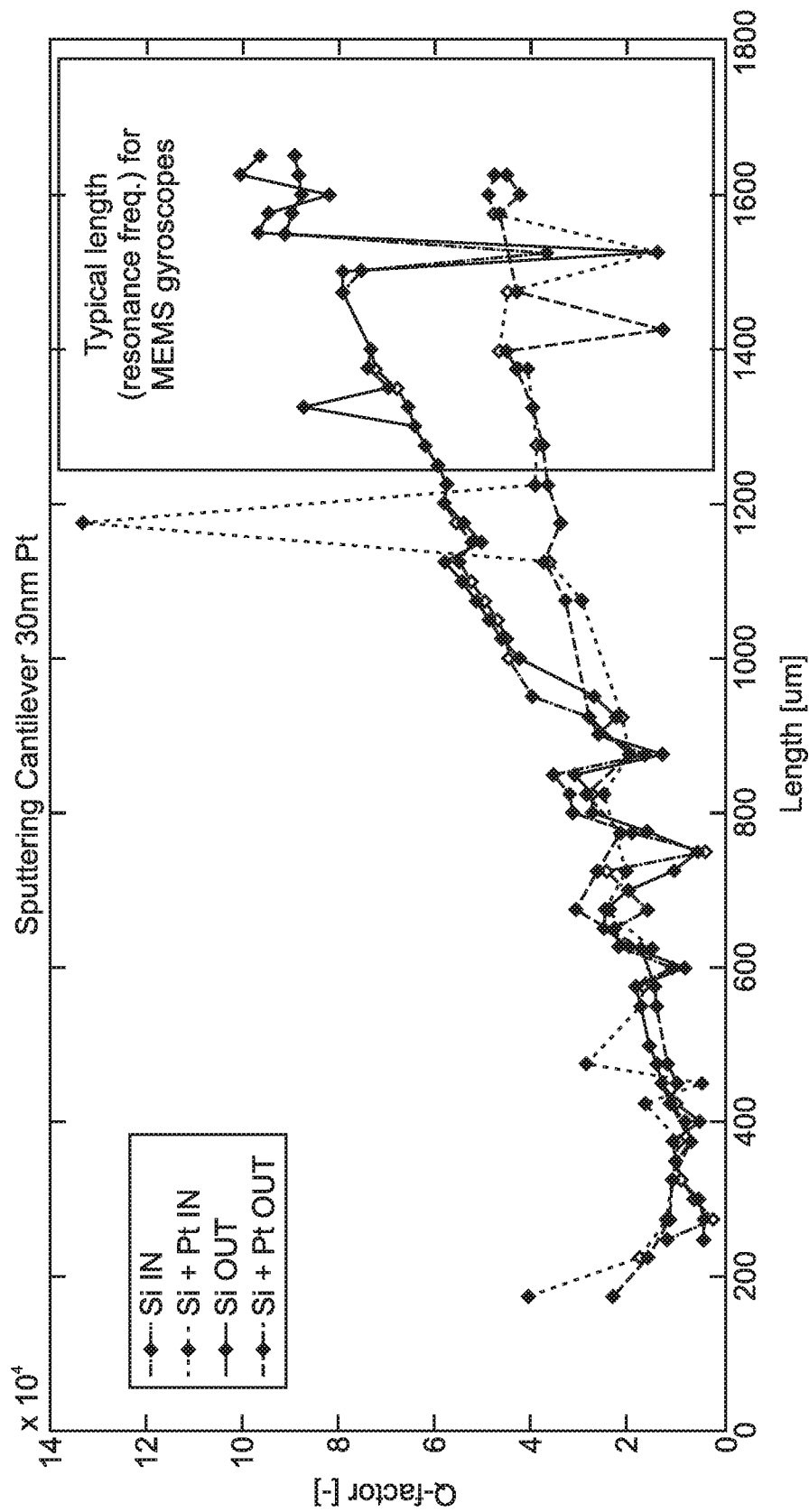
FIG. 18 is a graph showing reduction of Q-factor for a flexural mode of a cantilever of bare silicon, and silicon with sputtered platinum.

FIG. 18 is a graph of measurement showing reduction of Q-factor for 1st fundamental flexural mode of a cantilever of bare silicon (thickness 20 µm, width 20 µm) for in-plane, out-of-plane, and silicon with 30 nm of sputtered platinum for in-plane mode and out-of-plane mode. The reduction is more than 60% for typical frequencies (length) for tuning fork gyroscopes.

Figure 19:
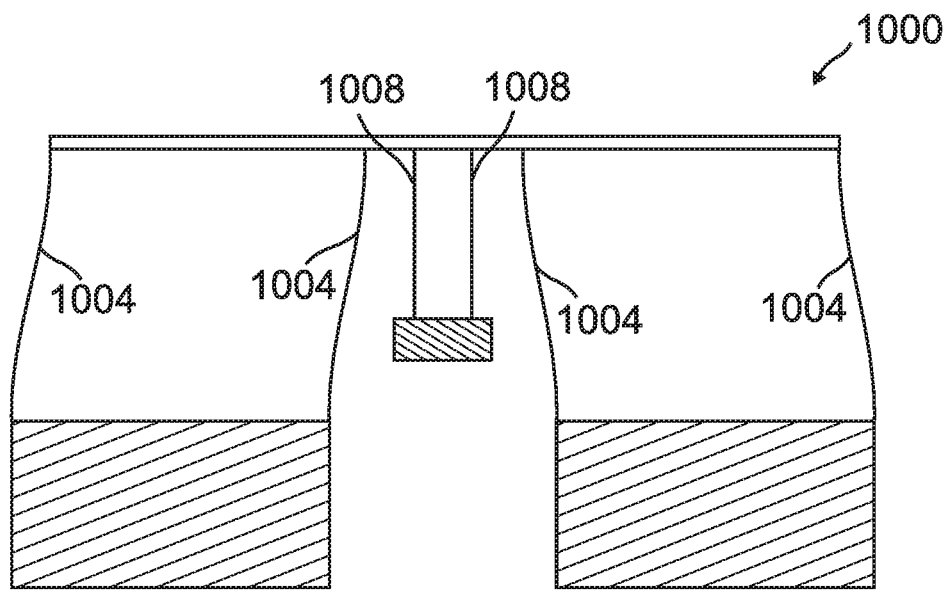
FIG. 19 is a schematic depiction showing the deformation of a gyroscope suspension structure under a drive force.

FIG. 19 is a schematic depiction showing the deformation of a gyroscope suspension structure 1000 under a drive force. In particular, FIG. 19 shows deformation of a set of drive suspensions 1004 and anchor suspensions 1008 under drive force (desired/operational mode). In this case, for a given force, the amount of deformation is proportional to the amount of elastics strain energy, showing that most of the energy of the drive mode is within the drive suspension.

Figure 20:
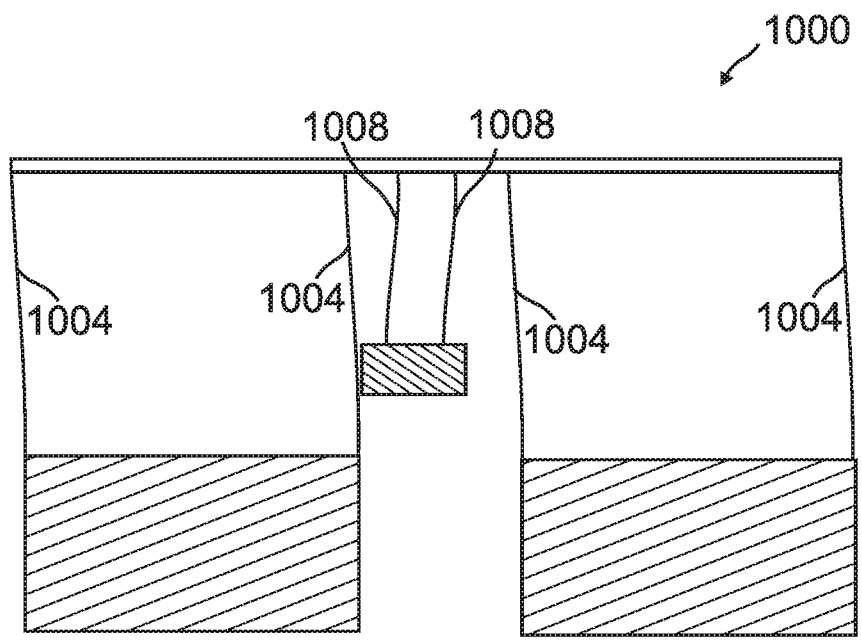
FIG. 20 is a schematic depiction showing the deformation of a gyroscope suspension structure under vibration.

FIG. 20 is a schematic depiction showing the deformation of gyroscope suspension structure 1000 under vibration. In particular, FIG. 20 shows deformation of drive suspensions 1004 and anchor suspensions 1008 under vibration (undesired mode). Again, for a given force, the amount of deformation is proportional to the amount of elastics strain energy, showing that most of the energy when the structure undergoes vibration is within the anchor suspension.

Figure 21:
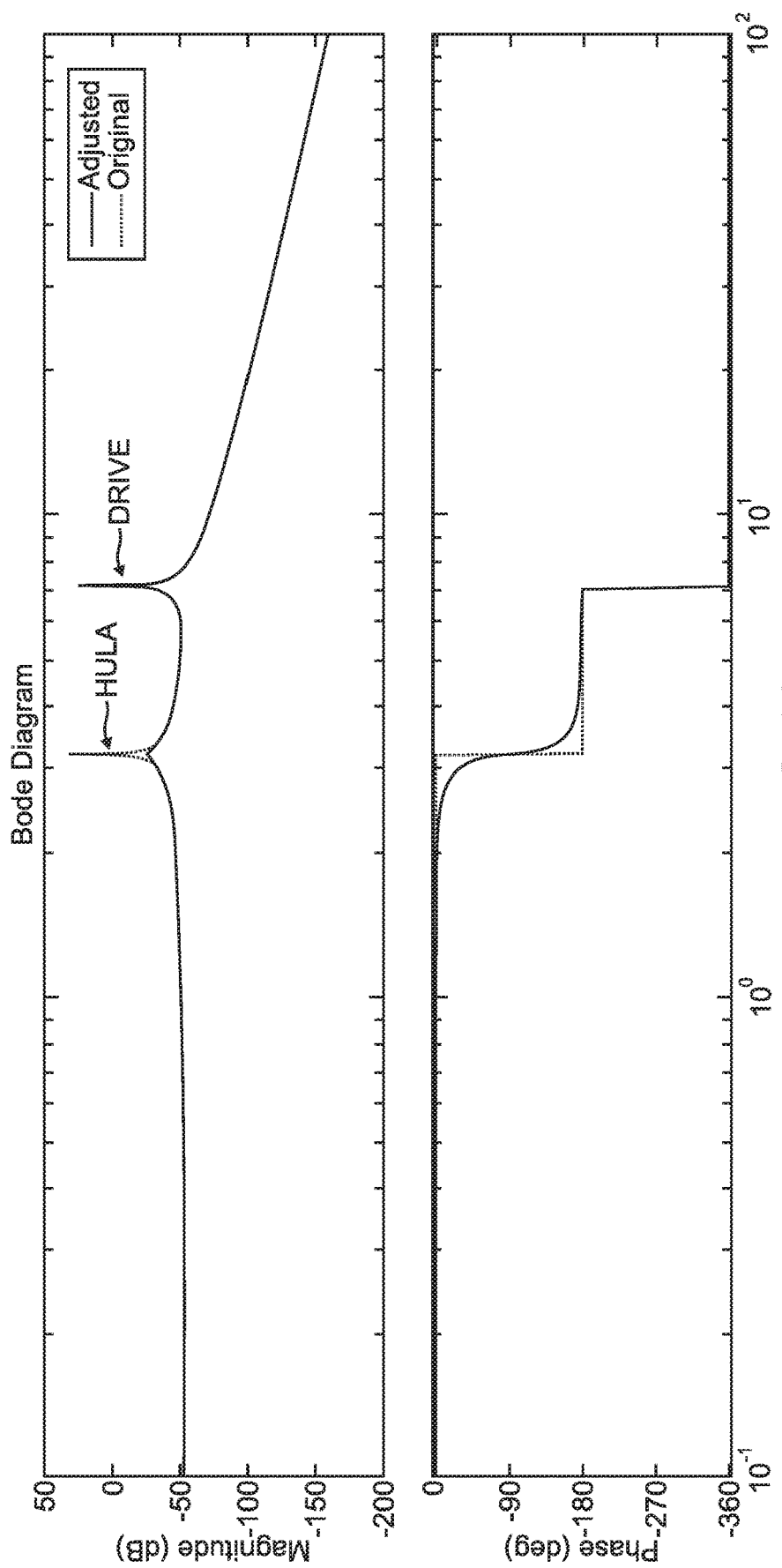
FIG. 21 is a graph showing the frequency response of hula and drive modes of a gyroscope without adjusted damping, and a gyroscope with adjusted damping.

FIG. 21 is a graph of a simulation, which shows the frequency response of a gyroscope without adjusted damping (dotted line), and a gyroscope with adjusted damping (solid line). The simulation shows the reduction of displacement for the undesired mode (hula) while keeping the displacement of desired mode (drive) unaltered.

Figure 22:
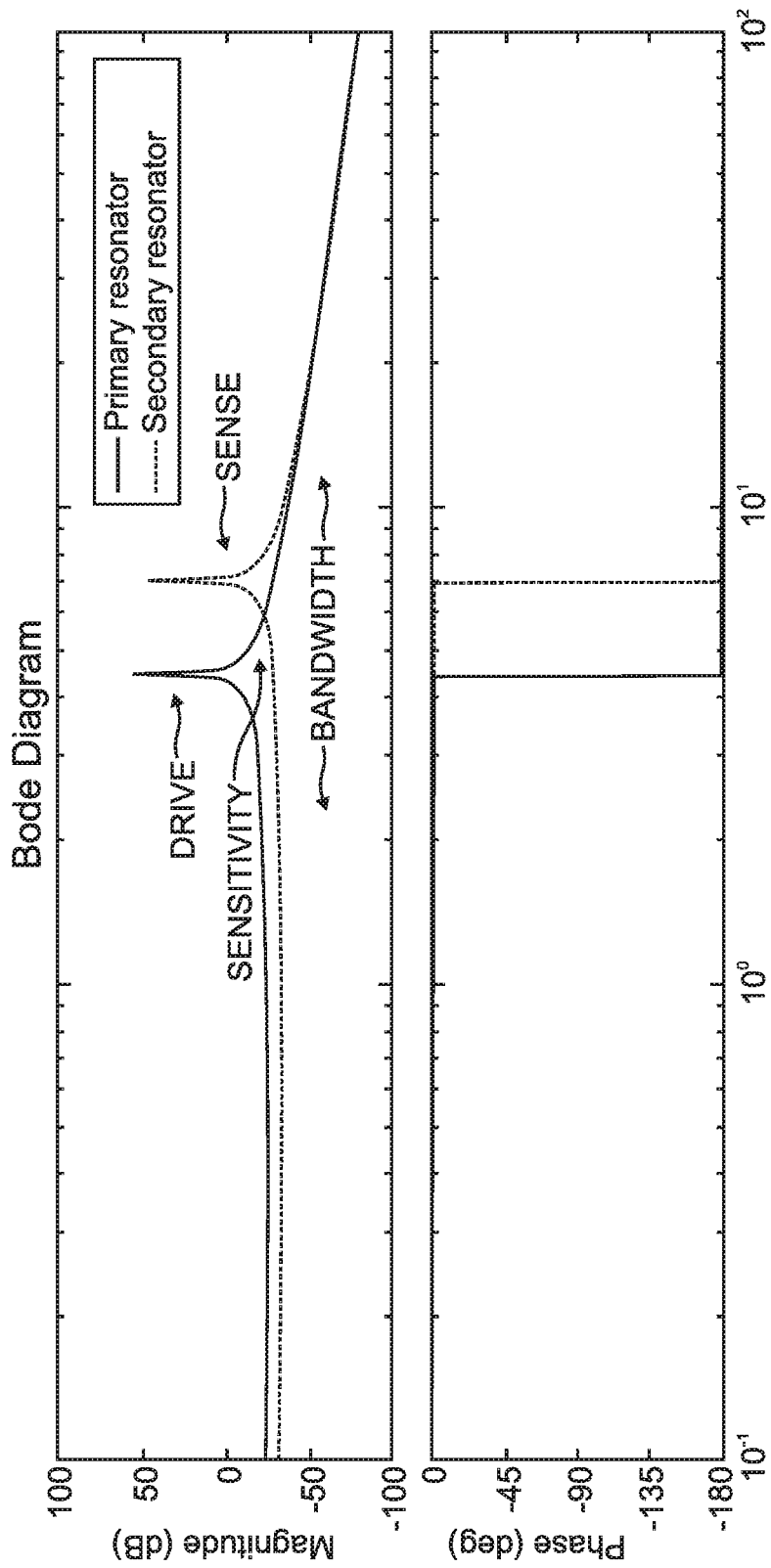
FIG. 22 is a graph showing the response of a drive mode and a sense mode of a gyroscope with split mode operation.

FIG. 22 is a graph of a simulation, which shows the response of drive mode and sense mode of a gyroscope with split mode operation. The sensitivity is defined by the magnitude of the response for sense mode at the frequency of drive mode. The bandwidth is defined as a frequency band in which the sensitivity does not change more than 3 dB from the sensitivity at the frequency of drive. It is a function of frequency separation between sense and drive.

Figure 23:
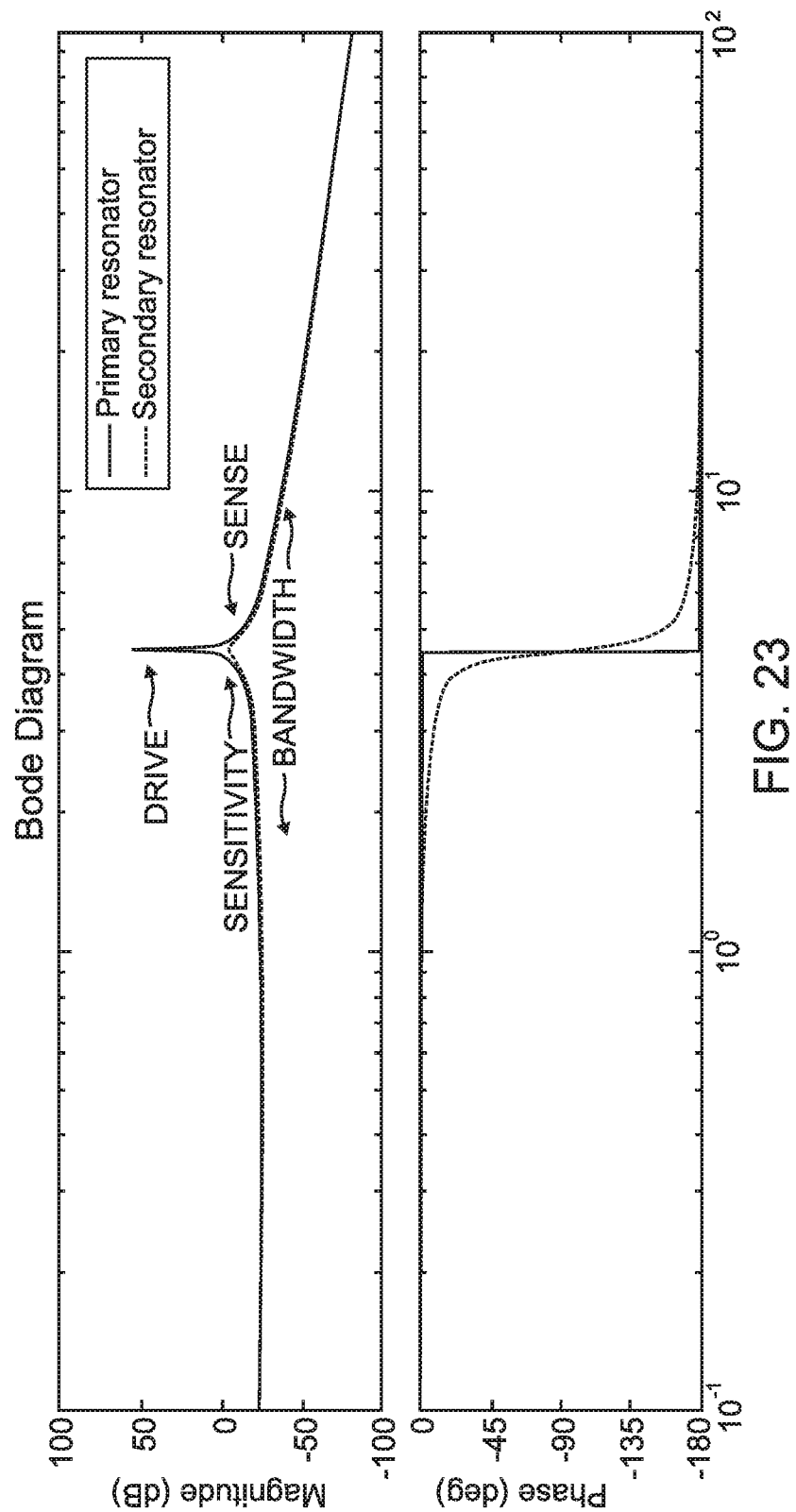
FIG. 23 is a graph showing the response of a drive mode and a sense mode of a gyroscope with mode-match operation and adjusted damping of sense suspension.

FIG. 23 is a graph of a simulation, which shows the response of drive mode and sense mode of a gyroscope with mode-match operation and adjusted damping of sense suspension. The sensitivity is reduced compared to the situation when the gyroscope would be unaltered. However, the sensitivity is higher than in the case of split mode operation (FIG. 22). The simulation further shows that the bandwidth of the altered gyroscope operated in mode match is higher than in the case of an unaltered gyroscope.

Figure 24:
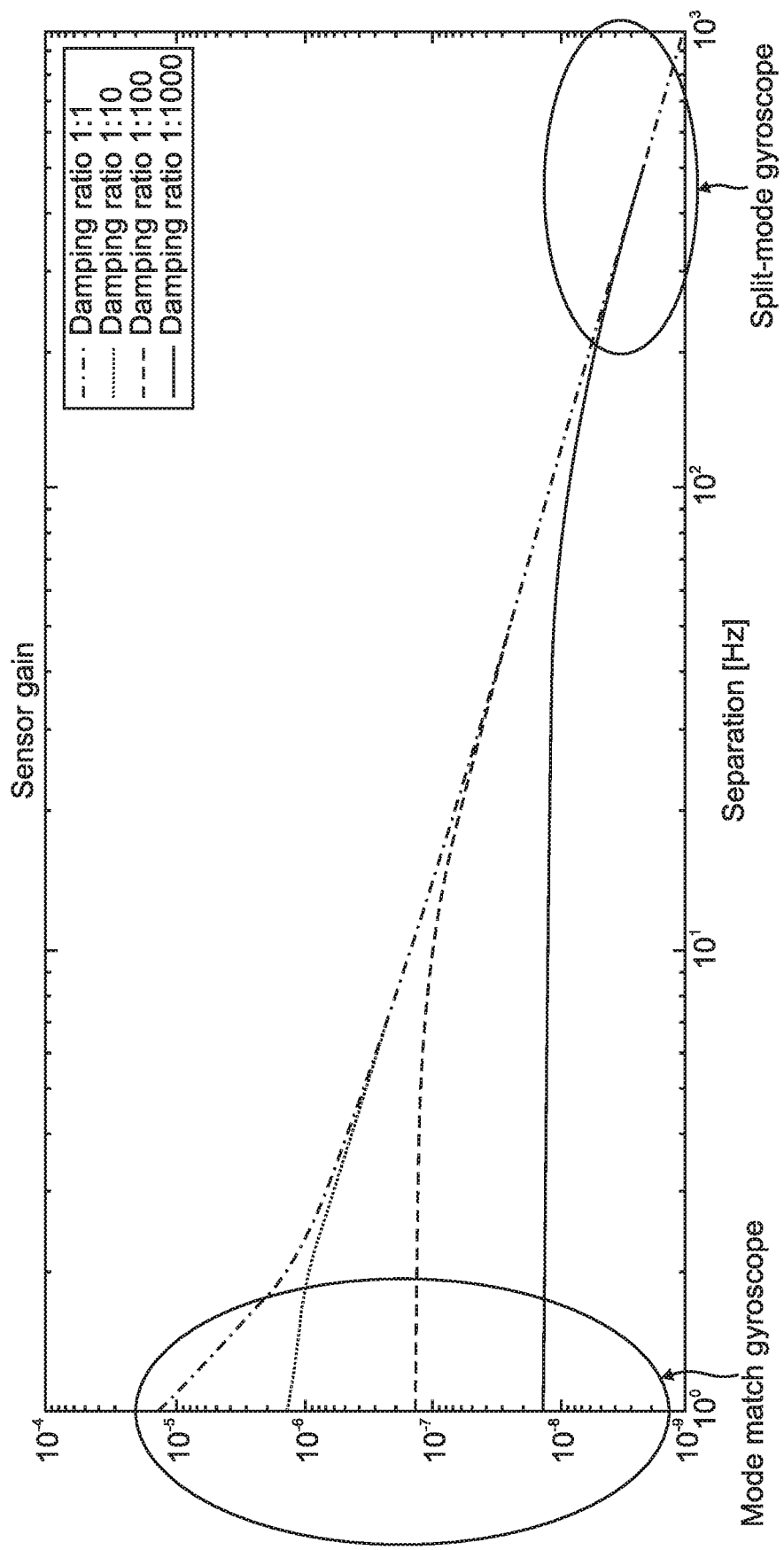
FIG. 24 is a graph that shows sensor gain as a function of frequency separation and ratio of damping between drive and sense modes.

FIG. 24 is a graph of a simulation, which shows sensor gain as a function of frequency separation and ratio of damping (Q-factors) between drive mode (Q-factor of 50000) and sense mode (Q-factor between 50000 and 50). The graph shows typical operating range of frequency separation for a split-mode gyroscope which has low gain, and operating range of frequency separation for a mode match gyroscope which has high gain.

Figure 25:
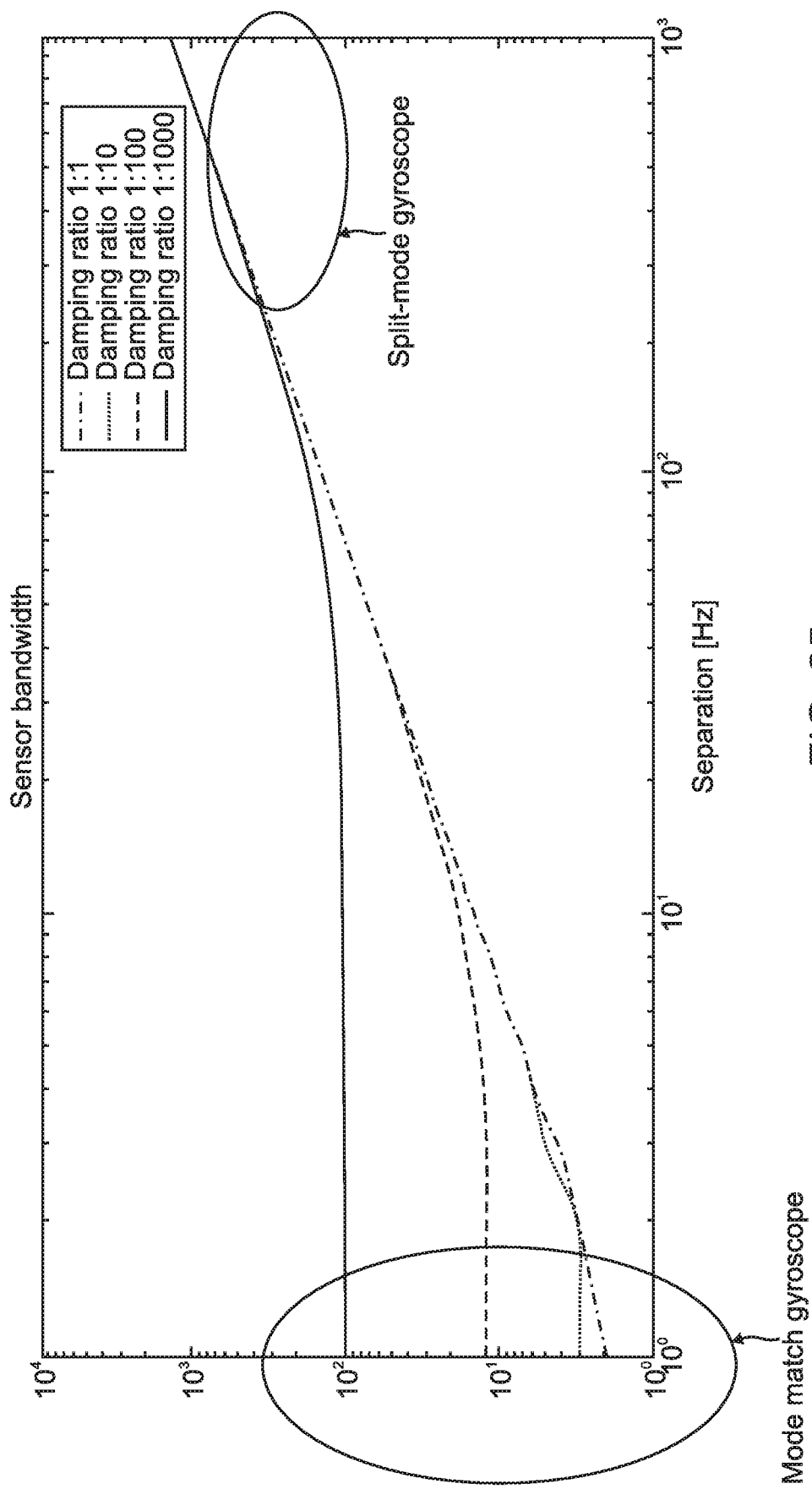
FIG. 25 is a graph that shows sensor bandwidth as a function of frequency separation and ratio of damping between drive and sense modes.

FIG. 25 is a graph of a simulation, which shows sensor bandwidth as a function of frequency separation and ratio of damping (Q-factors) between drive mode (Q-factor of 50000) and sense mode (Q-factor between 50000 and 50). The graph shows typical operating range of frequency separation for split-mode gyroscope which has high bandwidth, and operating range of frequency separation for a mode match gyroscope which has low bandwidth.

Example Embodiments

Example 1 includes a micro-electro-mechanical systems (MEMS) device comprising a substrate; one or more suspension structures connected to the substrate; one or more metallized layers on the one or more suspension structures; and one or more sense structures connected to the one or more suspension structures; wherein the one or more metallized layers provide selectively adjusted damping of the one or more suspension structures.

Example 2 includes the MEMS device of Example 1, wherein the one or more metallized layers comprise platinum, titanium, zinc, aluminum, copper, nickel, silver, gold, chromium, molybdenum, or combinations thereof.

Example 3 includes the MEMS device of Example 2, wherein the one or more suspension structures comprise silicon.

Example 4 includes the MEMS device of Example 1, wherein the one or more metallized layers comprise platinum, titanium, or a composite thin film of platinum and titanium.

Example 5 includes the MEMS device of Example 4, wherein the one or more suspension structures comprise silicon.

Example 6 includes the MEMS device of any of Examples 1-5, wherein the one or more metallized layers have a thickness with respect to a thickness of the one more suspension structures in a ratio range of about 1:100 to about 1:10.

Example 7 includes the MEMS device of any of Examples 1-6, wherein the MEMS device comprises a gyroscope or an accelerometer.

Example 8 includes a method of fabricating a MEMS device, the method comprising: forming one or more sense structures that are connected to a substrate with one or more suspension structures; and depositing one or more metallized layers on the one or more suspension structures to selectively adjust damping of the one or more suspension structures.

Example 9 includes the method of Example 8, wherein the one or more metallized layers are deposited by a physical vapor deposition process comprising sputtering or evaporation.

Example 10 includes the method of any of Examples 8-9, wherein the one or more metallized layers are deposited to have a thickness with respect to a thickness of the one more suspension structures in a ratio range of about 1:100 to about 1:10.

Example 11 includes the method of any of Examples 8-10, wherein the one or more metallized layers comprise platinum, titanium, zinc, aluminum, copper, nickel, silver, gold, chromium, molybdenum, or combinations thereof.

Example 12 includes the method of Example 11, wherein the one or more suspension structures comprise silicon.

Example 13 includes the method of any of Examples 8-12, wherein the fabricated MEMS device comprises a gyroscope or an accelerometer.

Example 14 includes a MEMS package comprising: at least one MEMS inertial sensor comprising one or more suspension structures connected to a substrate, one or more metallized layers on the one or more suspension structures, wherein the one or more metallized layers provide selectively adjusted damping of the one or more suspension structures, and one or more sense structures connected to the one or more suspension structures; a getter structure adjacent to the at least one MEMS inertial sensor; and a set of bond pads electrically connected to the at least one MEMS inertial sensor.

Example 15 includes the MEMS package of Example 14, wherein the one or more metallized layers have a thickness with respect to a thickness of the one more suspension structures in a ratio range of about 1:100 to about 1:10.

Example 16 includes the MEMS package of any of Examples 14-15, wherein the at least one MEMS inertial sensor comprises a gyroscope that is operated in a mode-match configuration with a lower bandwidth and a higher sensitivity.

Example 17 includes the MEMS package of Example 16, further comprising a second gyroscope without one or more metallized layers for adjusted damping, the second gyroscope operated in a split mode with a higher bandwidth and a lower sensitivity.

Example 18 includes the MEMS package of Example 14, wherein the at least one MEMS inertial sensor comprises an accelerometer.

Example 19 includes the MEMS package of Example 18, further comprising a gyroscope without one or more metallized layers for adjusted damping.

Example 20 includes the MEMS package of Example 14, wherein the at least one MEMS inertial sensor includes a plurality of gyroscopes and accelerometers configured as an inertial measurement unit (IMU).

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A micro-electro-mechanical systems (MEMS) device, comprising:
   a substrate;
   at least two proof masses planarly aligned with each other over the substrate,
   a set of suspension structures that connect the proof masses to the substrate;
   one or more metallized layers on the suspension structures;
   at least two sense electrodes coupled to the substrate, the sense electrodes adjacent to and separate from the proof masses, the sense electrodes configured to measure a charge generated by out-of-plane motion of the proof masses; and
   a pick-off comb located between the proof masses, the pickoff comb configured to measure the charge generated by in-plane out-of-phase motion of the proof masses;
   wherein the one or more metallized layers provide selectively adjusted damping of the suspension structures.

2. The MEMS device of claim 1, wherein the suspension structures comprise silicon; and
   the one or more metallized layers comprise platinum, titanium, zinc, aluminum, copper, nickel, silver, gold, chromium, molybdenum, or combinations thereof.

3. The MEMS device of claim 1, wherein the one or more metallized layers comprise:
   a composite thin film of platinum and titanium.

4. The MEMS device of claim 3, wherein the suspension structures comprise silicon.

5. The MEMS device of claim 1, wherein the one or more metallized layers have a thickness with respect to a thickness of the suspension structures in a ratio range of about 1:100 to about 1:10.

6. The MEMS device of claim 1, wherein the MEMS device comprises a gyroscope or an accelerometer.

7. The MEMS device of claim 1, further comprising at least two drive combs that are respectively adjacent to each of the proof masses on opposing sides from the pick-off comb, the drive combs configured to generate an electrostatic force to drive the MEMS device.

8. The MEMS device of claim 1, wherein the set of suspension structures include a set of drive suspensions that connect the proof masses to a pair of opposing base suspensions, which are connected to a set of anchor suspensions;
wherein the anchor suspensions are respectively connected to a pair of anchors coupled to the substrate.

9. A method of fabricating a micro-electro-mechanical systems (MEMS) device, the method comprising:
forming at least two proof masses planarly aligned with each other and connected to a substrate with a set of suspension structures;
forming at least two sense electrodes on the substrate adjacent to and separate from the proof masses, the sense electrodes configured to measure a charge generated by out-of-plane motion of the proof masses;
forming a pick-off comb between the proof masses, the pick-off comb configured to measure the charge generated by in-plane out-of-phase motion of the proof masses; and
depositing one or more metallized layers on the suspension structures to selectively adjust damping of the suspension structures.

10. The method of claim 9, wherein the one or more metallized layers are deposited by a physical vapor deposition process comprising sputtering or evaporation.

11. The method of claim 9, wherein the one or more metallized layers are deposited to have a thickness with respect to a thickness of the suspension structures in a ratio range of about 1:100 to about 1:10.

12. The method of claim 9, wherein the suspension structures comprise silicon; and
the one or more metallized layers comprise platinum, titanium, zinc, aluminum, copper, nickel, silver, gold, chromium, molybdenum, or combinations thereof.

13. The method of claim 9, wherein the fabricated MEMS device comprises a gyroscope or an accelerometer.

14. A micro-electro-mechanical systems (MEMS) package, comprising:
at least one MEMS inertial sensor comprising:
at least two proof masses planarly aligned with each other and connected to a substrate through a set of suspension structures;
one or more metallized layers on the suspension structures, wherein the one or more metallized layers provide selectively adjusted damping of the suspension structures;
at least two sense electrodes coupled to the substrate, the sense electrodes adjacent to and separate from the proof masses, the sense electrodes configured to measure a charge generated by out-of-plane motion of the proof masses; and
a pick-off comb located between the proof masses, the pickoff comb configured to measure the charge generated by in-plane out-of-phase motion of the proof masses;
a getter structure adjacent to the at least one MEMS inertial sensor; and
a set of bond pads electrically connected to the at least one MEMS inertial sensor.

15. The MEMS package of claim 14, wherein the one or more metallized layers have a thickness with respect to a thickness of the suspension structures in a ratio range of about 1:100 to about 1:10.

16. The MEMS package of claim 14, wherein the at least one MEMS inertial sensor comprises a gyroscope that is operated in a mode-match configuration with a lower bandwidth and a higher sensitivity.

17. The MEMS package of claim 16, further comprising:
a second gyroscope without one or more metallized layers for adjusted damping, the second gyroscope operated in a split mode with a higher bandwidth and a lower sensitivity.

18. The MEMS package of claim 14, wherein the at least one MEMS inertial sensor comprises an accelerometer.

19. The MEMS package of claim 18, further comprising a gyroscope without one or more metallized layers for adjusted damping.

20. The MEMS package of claim 14, wherein the at least one MEMS inertial sensor includes a plurality of gyroscopes and accelerometers configured as an inertial measurement unit (IMU).

* * * * *